United States Patent [19]

Hunter, Jr. et al.

[11] Patent Number: 5,633,735
[45] Date of Patent: May 27, 1997

[54] USE OF FRESNEL ZONE PLATES FOR MATERIAL PROCESSING

[75] Inventors: Robert O. Hunter, Jr., Rancho Santa Fe; Adlai H. Smith, San Diego; Clark C. Guest, San Diego; Bruce B. McArthur, San Diego, all of Calif.

[73] Assignee: Litel Instruments, San Diego, Calif.

[21] Appl. No.: 177,356

[22] Filed: Jan. 3, 1994

Related U.S. Application Data

[63] Continuation-in-part of Ser. No. 940,008, Sep. 3, 1992, Pat. No. 5,362,940, which is a continuation of Ser. No. 612,212, Nov. 9, 1990, abandoned.

[51] Int. Cl.$^6$ .................. G02B 5/32; G02B 27/44; G03H 1/08; B23K 26/00
[52] U.S. Cl. .................. 359/15; 359/9; 359/565; 219/121.68
[58] Field of Search .................. 359/9, 15, 565, 359/566, 569, 572, 742; 219/121.68, 121.73

[56] References Cited

U.S. PATENT DOCUMENTS

| | | | |
|---|---|---|---|
| 3,957,353 | 5/1976 | Fienup et al. | 359/564 |
| 4,897,325 | 1/1990 | Akkapeddi et al. | 430/5 |
| 4,909,818 | 3/1990 | Jones | 219/121.68 |
| 5,218,423 | 6/1993 | Kishner | 359/566 |
| 5,227,915 | 7/1993 | Grossinger et al. | 359/565 |
| 5,367,400 | 11/1994 | Harris et al. | 359/216 |
| 5,393,634 | 2/1995 | Maker et al. | 430/1 |
| 5,438,441 | 8/1995 | Rocksroh et al. | 359/15 |

OTHER PUBLICATIONS

Swanson, G.J., (1989) "Binary Optics Technology: The Theory and Design of Multi-level Diffractive Optical Elements", Technical Report 854:1–47.

Primary Examiner—Paul M. Dzierzynski
Assistant Examiner—Audrey Chang
Attorney, Agent, or Firm—Townsend and Townsend and Crew LLP

[57] ABSTRACT

Optical machining of a workpiece with coherent light scanning a plate with a plurality of subaperture subapertures is disclosed. Each of the subapertures creates a working image which when scanned with a coherent wave front of the design frequency forms in three dimensional space the working image. The working image when registered to a workpiece effect processing of the workpiece, usually ablating an aperture such as a blind via of small dimension. Improved techniques of dimensioning and fabricating the subaperture, creating amplitude modulation with the phase plate, and finally controlling amplitude with optical features close to the limit of producible optical elements is disclosed. The apparatus for the process, the process and the plate for utilization in the process are set forth.

46 Claims, 18 Drawing Sheets

USE OF FRESNEL ZONE PLATES FOR MATERIAL PROCESSING

RELATED APPLICATIONS

This application is a Continuation-in-Part of Ser. No. 07/940,008 filed Sep. 3, 1992, now U.S. Pat. No. 5,362,940, which was a File Wrapper Continuation of Ser. No. 07/612,212 filed Nov. 9, 1990, now abandoned.

BACKGROUND OF THE INVENTION

Very small holes of arbitrary contours are important for many applications, including fabricating vias in printed circuit boards and integrated circuit packages. Traditional mechanical means of forming vias, such as drills or punches, are capable of forming vias as small as 0.004 inch (0.10 mm). Below this limit, lithographic or optical techniques must be used.

One of the optical techniques for micro-machining is direct ablation with a laser focused onto the workpiece with a microscope. Vias are drilled one-at-a-time with the stage on which the workpiece sits scanning to the next via to be formed, repeating the procedure until all of the vias are formed. This technique may include the use of a patterned metal mask over the surface of the substrate so that the laser ablates material only through the openings in the metal. After ablation, the metal can be patterned or removed as the design requires. The processing quality of this method is limited in that it takes a relatively long time to complete a single workpiece.

Lithographic techniques include determining the pattern of vias with photoresist, then subjecting the workpiece to reactive ion etch. The photoresist is subsequently removed leaving the vias patterned in the workpiece. The reactive ion etch involves the use of a very expensive piece of equipment, and several additional process steps are required for patterning, etch and photoresist strip.

It is known that laser machining can be done using modulated zone plates, holographic optical elements and binary phase gratings. These diffractive optics are more efficient than mask-based techniques, theoretically being capable of directing 100% of the incident light into a desired image. However, these diffractive optics techniques are limited in that many of them are only capable of generating a periodic matrix of spots, and they often require a refractive lens for focusing, which may reduce efficiency and introduce aberrations and distortion.

It would be desirable to provide an apparatus and method for machining and material processing which provides the efficiency of diffractive optics techniques and a laser, while permitting the formation of an arbitrary pattern which may be created for specific applications. It is such an apparatus and method to which the present invention is directed.

SUMMARY OF THE INVENTION

It is an advantage of the present invention to provide a system which uses diffractive optics techniques to form an arbitrary pattern for machining and material processing.

It is a further advantage of the present invention to permit the simultaneous processing of multiple areas within the field of view using approximately parallel beams of uniform power, and without having to step or scan the stage on which the workpiece is mounted.

It is another advantage of the present invention to permit highly accurate alignment of the diffractive optic with the workpiece to assure correct location of the beams.

In an exemplary embodiment the apparatus for drilling vias or holes in a circuit board includes an excimer laser and a Fresnel zone plate (FZP) positioned parallel to the circuit board, with the distance between the FZP and the circuit board being the focal length of the FZP. For each via to be formed in the circuit board a corresponding FZP is patterned onto an FZP array. Each FZP may be patterned directly centered over the desired via location or in high density patterns it may be located off-center from the via with deflection being accomplished by the formation of finer circular arcs on the side of the FZP opposite the desired direction of deflection.

General Plate Construction

In the following description, certain terms will be used. Although reflection is a candidate for the apparatus and process here set forth, transmission is preferred. Reflection requires angularity between the plate producing working images and the workpiece. A transmission mode of operation generally leads to simpler opto-mechanical arrangements and is therefore preferred. Accordingly, and in the remainder of the text, where transmission is included, substitution of reflection will be understood.

As in the example above, it is the object of the method and apparatus to produce and describe optical plates. Each plate will be divided into subapertures. Each of these subapertures will produce one working image for incidence on a workpiece, typically for machining. It is to be understood that the preferred embodiment of this disclosure is machining.

In addition to machining, the present invention can be useful for other tasks that require patterning material over a wide area such as photoresist exposure, imaging photosensitive polyimide or chemically enhanced etching. In broader terms, the described plates and other techniques are useful in any sort of wide area patterning. The plate will be suitable for scanning by an incident beam of coherent light having sufficient fluence to produce with the working image a working effect at a workpiece, in the usual case this producing an aperture or via in the workpiece. The present invention is not limited to producing apertures or vias but can be used for producing 3-dimensional shapes as well, an example of such a task being the formation of a magnetic disc head slide or producing an inkjet nozzle with a specified wall shape. Thus, an incident beam of coherent light at each subaperture will have an incident wave converted in phase and amplitude during reflection or transmission at the plate to reproduce from each subaperture as it is scanned the desired image on a workpiece being processed.

A beam scanner is included to provide a more uniform illumination of the FZP by the laser beam. The scanning ameliorates the effect of spatial and temporal nonuniformity in laser beam intensity.

In this Continuation-in-Part Patent Application, we include four discrete improvements. These improvements include generalizations in the technique of subaperture broadcast, feature width amplitude modulation, phase and amplitude modulation to avoid minimum feature size, and plate design practice for achieving certain shapes such as lines, circles and curves.

Before we begin a discussion of these discrete areas of novelty, it is necessary to review extant procedures which we preferably use for plate fabrication.

General Method of Plate Construction

Typical plates and methods of constructing the plates are shown. Plate construction assumes that the desired image for machining by each subaperture is known and includes the following steps.

First, the desired image for working on a workpiece is chosen. For most purposes here discussed, it will constitute a cylindrical hole extending through at least one layer of a workpiece. Although an advantage of the present technique is the ability to produce arbitrary shapes and intensity profiles on the workpiece for patterning purposes, it will be understood that the generation of through holes or so-called vias, including blind vias, is a primary object of this disclosure.

Second, the phase and amplitude modulation that the plate is to impress on the incident wavefront is determined; said phase and amplitude modulation being in the dominant diffracted order(s) produced by the plate. Using known back propagation techniques—except as modified specifically herein—the chosen desired image is back propagated in a computer model from its working distance on the workpiece to the plane of the plate. The coherent frequency of the scanning beam is assumed in the back propagation. Other techniques, such as iterative back propagation or simulated annealing can also be used to determine the phase and amplitude modulation to be impressed on the incident wavefront.

Finally, a pixel map is made containing phase and amplitude information and the plate is encoded. Such encoding occurs with the plate map being interrogated on a pixel-by-pixel basis and a decision being made at each pixel location. This decision is to etch or otherwise optically code the plate at the pixel, given the phase and amplitude change desired on the incident coherent light. The amount of phase and amplitude modulation produced by the plate on coherent incident light is sufficient to recreate the selected working image for processing the workpiece.

The encoding techniques commonly utilized are the mathematical algorithms applied to the desired hologram phase and amplitude modulation to determine what the shape and depths of the patterned regions will be that represent the phase and amplitude modulation. Thus far we have described the encoding as being done with circular arcs whose form creates a focused spot at the workpiece. This particular encoding represents an idealization since in practice the fidelity with which a pattern can be rendered on a computer generated hologram is limited by a number of factors, among them are the minimum fabricateable feature size, overall dataset size and writer address size/resolution. The influence of these factors on various encoding schemes is well known.

So, given the phase and amplitude modulation to be produced within any subaperture of the plates described here, we can utilize any of the known encoding schemes. Examples of encoding algorithms are those of Lee in the article entitled *Binary Synthetic Holograms* appearing in the July 1974 issue of Applied Optics at Volume 13, No. 7 at pages 1677 to 1682; and Arnold in the article entitled *Electron Beam Fabrication of Computer-Generated Holograms* appearing in the September–October 1985 issue of Optical Engineering at Volume 24, No. 5 pages 803–806.

As described in the literature, the algorithms apply to transmission diffractive optic elements (DOE). These same algorithms are word for word applicable to reflective and transmission binary phase diffractive optical elements.

The only difference between phase and amplitude transmission binary diffractive optical element is that the normally opaque areas are now "opened up" while the normally transparent areas are etched to produce a wave advanced or retarded by $\pi$ radius.

Encoding techniques for multilevel, maximum efficiency diffractive optical elements are described in U.S. Pat. No. 4,895,790 to Swanson et al. entitled High-Efficiency, Multilevel, Diffractive Optical Elements. As will be seen hereafter, this disclosure—similar to this reference— discloses utilizing more than two levels in the techniques here disclosed. As will hereafter appear, we differentially vary the discrete feature widths to attain amplitude modulation of the incident wave—a result not suggested or disclosed in Swanson et al.

Once the encoding is done, standard techniques are thereafter utilized to create the plate. These can include writing a tape that contains the features to be made, utilizing the tape to drive an electron beam lithography tool, processing the exposed image, and etching the plate. Other known techniques such as direct write photolithography, contact printing photolithography, projection photolithography are applicable to the fabrication of the plate.

We contemplate herein the use of many standard lasers and glasses suitable for the use with these techniques. By way of the example, we include the following Table 1.

Table 1 lists some common lasers and glasses appropriate for high power and/or high fluence operation. At lower power levels, a choice can be made from a wider selection of materials. Power level is used in a relative sense; the scale being set by the particular laser. This list is illustrative only; other lasers and materials can be used for producing transmissive subaperture broadcast CGH (computer generated hologram). Table 2 defines the glass abbreviations.

TABLE 1

Lasers and suitable optical glasses for transmission FZPA's.

| Laser | λ (nanometers) | Glasses |
|---|---|---|
| $F_2$ (excimer) | 157 | VUVSFS, MgF, CaF |
| ArF (excimer) | 193 | VUVSFS, UVSFS, MgF, CaF |
| KrF (excimer) | 248 | UVSFS, MgF, CaF |
| Quadrupled YAG | 266 | UVSFS, MgF, CaF |
| XeCl (excimer) | 308 | UVSFS, MgF, CaF |
| XeF (excimer) | 353 | UVSFS, SFS, MgF, CaF, BK7 |
| Tripled YAG | 355 | UVSFS, SFS, MgF, CaF, BK7 |
| Doubled YAG | 532 | SFS, BK7 |
| YAG or YLF | 1060–1070 | SFSOH |
| $CO_2$ | 10600 | ZnS |

TABLE 2

Abbreviations used for various glass types.

| Abbreviation | Glass |
|---|---|
| UVSFS | ultraviolet synthetic fused silica |
| VUVSFS | vacuum ultraviolet synthetic fused silica |
| SFS | synthetic fused silica (ordinary visible grade) |
| SFSOH | low "OH" synthetic fused silica |
| BK7 | borosilicate crown glass (Schott catalog designation) |
| ZnS | zinc selenide |
| MgF | magnesium fluoride |
| CaF | calcium fluoride |

Plate Improvements

In the plate construction and process of construction set forth immediately above, we include four improvements to this process.

First we disclose the technique of subaperture broadcast as the most advantageous plate architecture.

Second, we disclose a technique for feature width amplitude modulation. Specifically, and utilizing three or more optical depth features (zero or no etch counting as one of the depths)—usually steps of plate thickness—we disclose a technique for varying differentially side-by-side feature dimension (or width) to obtain amplitude variation of the outgoing wavefront. In the normal or known case of phase and amplitude modulation utilizing three or more steps, such steps are given equal wave length retardant depths. For example, where three steps are used each step differs from its adjacent steps by ⅓ of a wave length; where four steps are used each step differs from its adjacent step by ¼ of a wave length. Typically, and in producing the desired image, all steps are given equal transverse width.

In the improved technique of this invention, all steps can be given differential width with respect to one another. This differential step width varies in accordance with the amplitude modulation desired on the outgoing wave at that location. This technique finds optimum usage with plates having four levels of phase altering features and allows greater flexibility in plate design than the known technique where the amplitude modulation of the plate is constant.

Third, we set forth a technique which allows desired phase and amplitude modulation to occur where continuous optical features producing the desired phase and amplitude would either be less than the minimum feature size that can be produced on a plate, or where it is desired to reduce the total number or complexity of optical elements in a given subaperture.

Specifically, there always exists a minimum element feature size which can be fabricated within the required tolerances. Unfortunately, and in the attempt to reach low values of amplitude modulation, design theory can call for features having a dimension less than the minimum feature size. According to one aspect of the technique here disclosed, the region with such less than minimum feature size is given a feature size greater than the minimum. This brings the less than minimum features sizes to that feature size which can be fabricated. Thereafter, this produced pattern is randomly interrupted. It is randomly interrupted at the optical features at intervals exceeding the minimum feature size with a probability that reduces total feature area to that required for generation of the design amplitude. The random interruption only introduces noise to the resultant image—which noise in most cases can be ignored. At the same time, the remaining structure generates the designed amplitude. There results a re-dimensioned array of elements-all exceeding minimum feature size—which in the aggregate achieve phase and amplitude modulation that would otherwise not be possible.

The plates resulting from this process have a telltale image. Typically, and especially in subaperture holograms, fringes produced by the optical elements have regular boundaries—that is to say they have the effect of producing continuous contiguous fringes. Where the process here outlined is practiced to control amplitude, such regular fringes are randomly interrupted. This random interruption is proportional to the desired amplitude to be produced by the plate at the fringe. In most regular patterns, this is recognizable.

Fourth, we disclose plate design practice for achieving certain design shapes. Preferred combinations of subapertures are disclosed for the generation of circles, curves and other shapes by the produced images. These images in turn impart their specific shapes to workpieces with use of the produced plates.

The alignment procedure described in our original patent application is no longer preferred. Other techniques have proven to be more useful. For the preferred alignment utilized in this invention as of the date of this Continuation-In-Part Patent Application, the reader's attention is invited to our co-pending U.S. patent application Ser. No. 08/121,060 filed Sep. 14, 1993 by the inventors herein entitled Apparatus and Process for Using Fresnel Zone Plates for Processing Materials, incorporated in this application by reference.

The alignment mechanism here originally disclosed uses a helium-neon laser, the beam from which is projected onto a surface relief grating on the workpiece. The reflected light from the surface relief grating is filtered to create interference fringes which, when aligned, provide maximum light intensity projected through a transmission grating on the Fresnel subaperture plate. While this is no longer preferred, it can still be utilized.

The FZP may be patterned to provide any contour hole by producing the pattern of the Fourier transform of the desired hole shape.

BRIEF DESCRIPTION OF THE DRAWINGS

Understanding of the present invention will be facilitated by consideration of the following detailed description of a preferred embodiment of the present invention, taken in conjunction with the accompanying drawings, in which like reference numerals refer to like parts and in which:

FIG. 14 is another example of a disconnected subaperture;

FIGS. 16A and 16B are respective views of a simple, full aperture broadcast hologram;

FIG. 17 is an example of overlapping subapertures not falling within the definition of subaperture broadcast computer generated holograms;

FIG. 18 is an example of overlapping subapertures falling within the definition of subaperture broadcast computer generated holograms;

FIG. 19 is another example of overlapping subapertures falling within the definition of subaperture broadcast computer generated holograms;

FIGS. 25A, 25B, 25C, and 25D are respective plan views of the technique that we call "chirping" in which FIG. 25A illustrates a prior art binary grating encoded to an amplitude of 1.0, FIG. 25B illustrates a prior art binary grating encoded to an amplitude of 0.5, FIG. 25C illustrates a binary grating producing an amplitude modulation of 0.5 utilizing the disclosed "chirping" technique; FIG. 25D illustrates another reduction in amplitude to 0.25 utilizing the disclosed "chirping" technique;

FIGS. 27A, 27B, 27C and 27D are respective plan views of the technique that we call "chirping" in which FIG. 27A illustrates a prior art tertiary grating encoded to an amplitude of 1.0. FIG. 27B illustrates a three level grating encoded to an amplitude of 0.5 by the technique of feature width modulation disclosed herein; FIG. 27C illustrates a "chirped" 3-level grating with feature sizes equal to the maximum (same as FIG. 27A) but amplitude modulation equal to 0.5, and FIG. 27D illustrates a further reduction in amplitude to 0.25 utilizing the disclosed "chirping" technique;

FIGS. 30–33 are drawings of a reflective computer generated hologram in which FIG. 30 is a side elevation view of the reflective hologram being scanned to produce a working image, FIG. 31 is a view of the produced image, FIG. 32 is a view of the holographic mask, and FIG. 33 is a side elevation section of the holographic mask; and, FIG. 34 is a perspective schematic illustrating how the working images of the computer generated holograms can be incident on surfaces other than a plane.

DESCRIPTION OF THE PREFERRED EMBODIMENT

Figure 1:
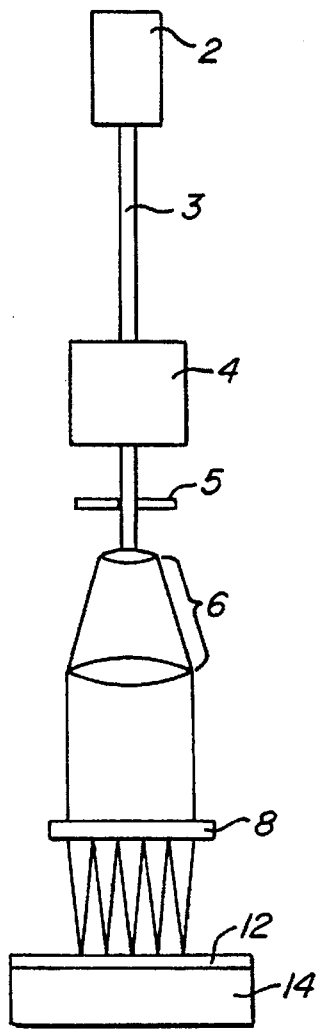
FIG. 1 is a diagrammatic view of the material processing system according to the preferred embodiment.

In the preferred embodiment shown in FIG. 1, the material processing system comprises a processing laser 2 for emitting beam 3, a beam scanner 4, a spatial filter 5, a beam expander/collimator optical train 6, a Fresnel zone plate array 8 and an alignment subsystem 10. The workpiece, illustrated as a circuit board 12 is mounted on stage 14.

Processing laser 2 is an excimer laser, which provides a single pulse brightness in ultraviolet light much greater than that emitted by other commercial lasers. The preferred excimer laser is KrF which emits at 248 nm and provides a power of 400 mJ/pulse for a 20 nsec pulse. This particular laser is selected for its ability to ablate polyimide which is used for printed circuit boards and alumina ($Al_2O_3$) which is used in ceramic packaging.

Beam scanner 4 is included because the laser beam quality has been tailored to the requirements for focusing the laser to the diameter specifications of a circuit board. The beam quality modifications generate a speckle pattern which decreases the uniformity of the laser intensity. Laser uniformity is an important parameter because it affects the diameter of the via. Since the polyimide has an energy threshold below which little ablation occurs, the profile of the laser beam will have the effect that a higher intensity pulse will be wider at the ablation threshold because the tails of the beam profile have increased in intensity. This results in an increase in hole diameter which creates a nonuniform distribution of hole diameters across the circuit board 12, possibly exceeding specified tolerances.

Figure 5:
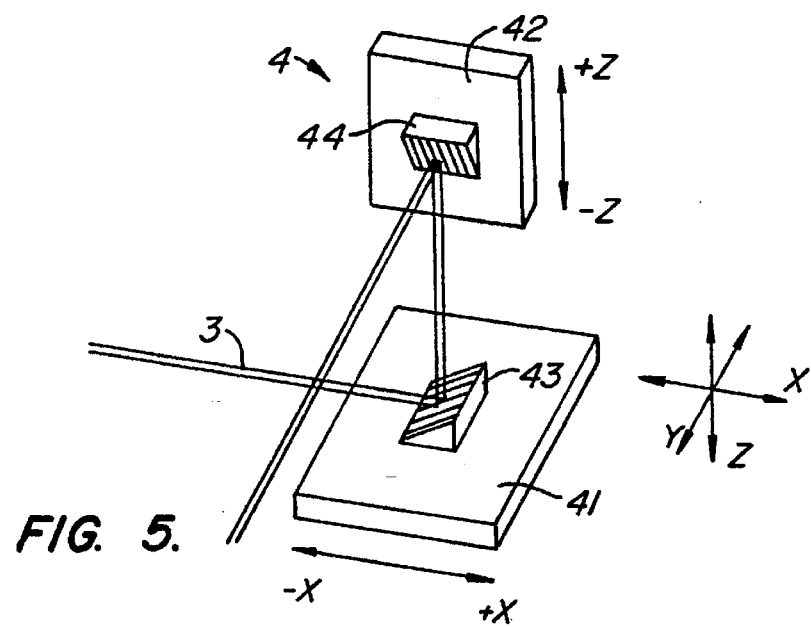
FIG. 5 is a perspective view illustrating motion for the beam scanner.

Beam scanner 4 alleviates the nonuniform intensity of the beam by causing the beam to continuously scan across a narrow region such that it overlaps itself at all locations during the scan. The beam scanner 4, shown in FIG. 5, consists of two stages 41 and 42 with reflectors 43 and 44. Stage 41 oscillates continuously in ±x-direction with reflector 43 mounted thereon at a 45° angle. Motion of stage 41 in ±x-direction causes the beam to move in the ±x-direction at the target plane while motion of stage 42 in ±z-direction causes the beam to move in the ±z-direction at the target plane. By appropriately programming the motion of stages 41 and 42, any desired scanning pattern in the target plane can be achieved. Stages 41 and 42 have tight pitch and yaw specifications so that the motion does not introduce any beam tilt.

Spatial filter 5 is a pinhole provided to permit spatial filtering of the input beam. The pinhole rejects highly divergent components of the laser beam.

Beam expander/collimator optical train 6 is illustrated a simple combination of lenses which expand the beam 3 to match the beam size to the workpiece then collimate the expanded beam. A more complex multiple lens telescope may also be used for precise magnification and speed, suggested values being 6:1 and f/20, respectively.

Fresnel zone plates (FZPs) are structures for focusing light that can be readily mass produced in arbitrary arrangements. They therefore provide an effective means for etching patterns of holes using laser light. A single substrate can be imprinted with a large number of FZPs using standard lithographic techniques. The operating principle of FZPs is the diffraction of light. The principle of diffraction states that a light wave will not travel in a straight path after passing through a small aperture (small meaning comparable in size to the wavelength), but will expand outward to fill the space behind the aperture. Thus, light beams passing through a screen with two or more apertures will overlap and combine. Because light is a wave, it has peaks and troughs in its amplitude. When beams combine, a peak in one beam may be canceled by a trough in another, leaving that location dark. This is called destructive interference. Likewise, at other locations, beams will combine so that two peaks or two troughs come together. This increases the amplitude of light at those locations and is called constructive interference. A screen with the correct pattern of apertures can be used to focus light. Light at the focus should have as high an amplitude as possible. Therefore, only apertures that contribute constructively interfering light to the focus position should be open in the screen. Whether an aperture contributes constructive or destructive light depends on the distance of the aperture from the focus. If one selects a particular aperture at a given distance from the focus, then all other apertures at that same distance to within plus or minus one quarter of a wavelength will contribute constructive light. Furthermore, all apertures within a quarter wavelength of that distance plus or minus an integer number of wavelengths will also contribute constructive light. The pattern that results if all constructive aperture locations on a screen are transparent and all destructive locations are opaque is a series of concentric rings with the spacing of the rings becoming closer for rings further from the center of the pattern. This pattern of rings is an FZP.

The total amplitude of light at the focus can be increased by using the light that would ordinarily be blocked by the opaque rings of the FZP. Destructive light can be turned to constructive light by changing its phase by half a wavelength. Thus, by replacing the opaque rings of the FZP with a thickness of transparent material that delays the light by one half wavelength, those regions can also constructively contribute to the focus, thereby doubling the total light amplitude. Materials etched by light at the focus react not to light amplitude, but to light intensity which is the square of the amplitude. Thus, doubling the amplitude increases the potential for etching by a factor of four.

Figure 2:
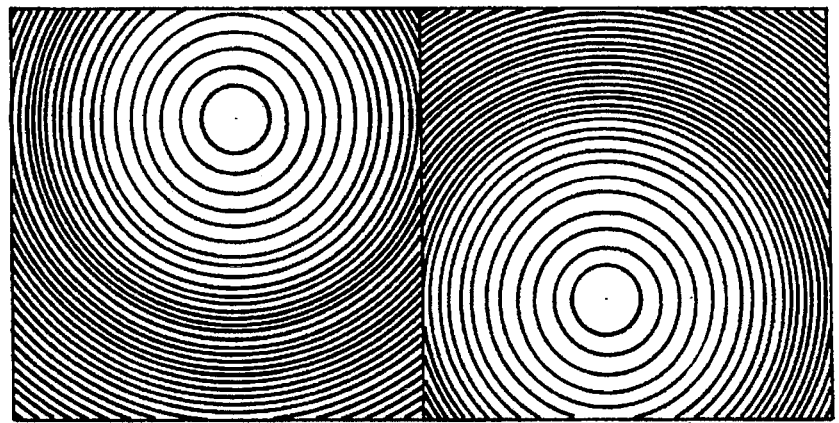
FIG. 2 illustrates a Fresnel zone plate array.

The procedure for fabricating a Fresnel subaperture plate involves the preparation of a mask using electron beam lithography. Since E-beam lithography involves directly "writing" the pattern into photoresist on the chrome mask plate, it is relatively little additional work to pattern a large number of subapertures on a single mask. The location of each subaperture is determined by the pattern of beam projection desired to simultaneously process selected locations of a workpiece. The perimeter of the FZP array will have a clear un-patterned area 7 on the order of 1 cm wide to permit inclusion of alignment features. After etching of the exposed chrome (under the unexposed resist) and stripping of the resist, a mask is created bearing a pattern of the desired FZP array. An example of such a pattern with partially overlapping FZPs is shown in FIG. 2. The ability to partially overlap the subapertures permits relatively close and arbitrary positioning of the selected areas of the workpiece as required. It should also be noted that the FZPs and the selected area on the workpiece corresponding need not be limited to a circular shape. By patterning the FZP as the Fourier transform of the desired shape virtually any shape via or hole can be drilled, including squares, polygons, asymmetric shapes, etc.

The mask is used to pattern photoresist on a quartz plate by projecting light through the mask to expose the resist. After exposure, the quartz is etched using either wet chemical (HF) or reactive ion etch (RIE). Wet etch can be used only where small spacing between the lines on the plate is not critical, because the isotropic nature of the wet etch results in undercut of the resist making dimensions difficult to control. RIE, an anisotropic etch, is preferred and is necessary to achieve narrow spacing between the lines with well-defined vertical steps.

The design of an FZP is as follows: the radius of the k-th circle that separates the rings of the subaperture is given by $\sqrt{k\lambda f}$, where $\lambda$ is the wavelength of light emitted by the processing laser 2 and f is the focal length of the Fresnel subaperture. The total number of bright and dark rings in a Fresnel subaperture with radius R is $K=R^2/\lambda f$. The width of the narrowest ring, which determines the resolution required for fabrication, is $\sqrt{K\lambda f}-\sqrt{(K-1)\lambda f}$. The etch depth of the quartz, which can be achieved by either etch technique, is $L=\lambda/[4(n-1)]$, where n is the refractive index of quartz, about 1.55. Etching precisely to this depth will give the highest optical power at the focused spot.

Figure 3A:
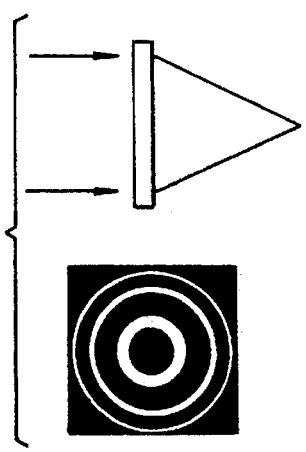
FIGS. 3a, 3b and 3c, illustrate Fresnel zone plates configured to achieve beam tilt at various angles.
Figure 3B:
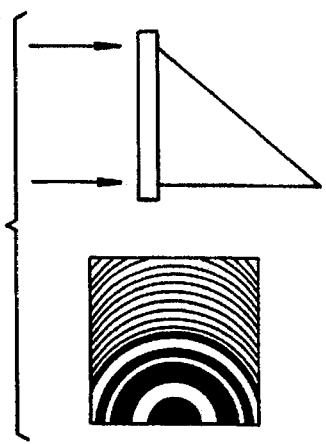
Figure 3C:
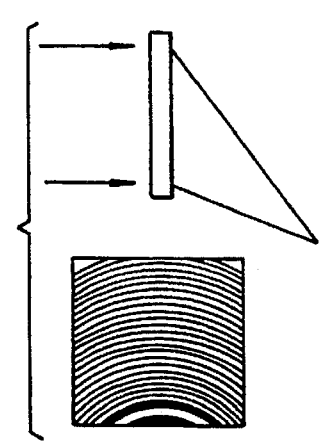

In the preferred embodiment of the system, FZP array 8 is positioned parallel to the circuit board 12, 50 millimeters away. Thus, the focal length of the FZP is 50 mm. The holes drilled in the circuit board 12 are 12.5 microns in diameter. The holes are randomly positioned on the workpiece and may be as close as 75 microns center-to-center. To etch 12.5 micron holes from a distance of 50 mm, the FZPs must be 1 mm in diameter, using subapertures centered over the holes as seen in FIG. 3a. To allow holes to approach to within 75 microns, the FZPs must be able to produce holes that are not centered behind the FZP, but deflected to one side as in FIGS. 3b and 3c. For a large diameter subaperture plate, any selected 1 mm square area of that pattern directs light to the focus behind the center of the pattern. Therefore, FZPs designed to produce holes not centered under them will be 1 mm square areas selected from the outer portion of larger FZPs. The more the hole is deflected from the center of the FZP, the finer the circular arcs of the FZP opposite the direction of deflection, as shown in FIG. 3c. Thus, the maximum deflection is limited by the minimum resolution of the fabrication process. The pitch L of the arcs is determined according to the relationship $L=\lambda/2\sin\theta$ where $\theta$ is the angle of deflection. If features as fine as 0.5 microns can be fabricated, then holes may be placed up to 4.5 mm from the center of the corresponding FZP element. These specifications will allow writing a diagonal line of holes on a 75 micron grid.

Figure 4A:
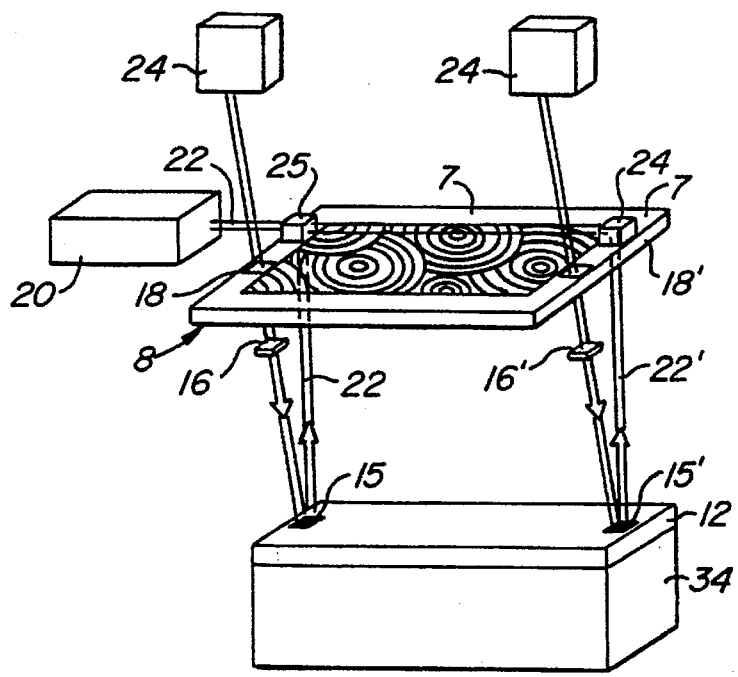
FIGS. 4a and 4b are respective perspective views of the alignment subsystem.
Figure 4B:
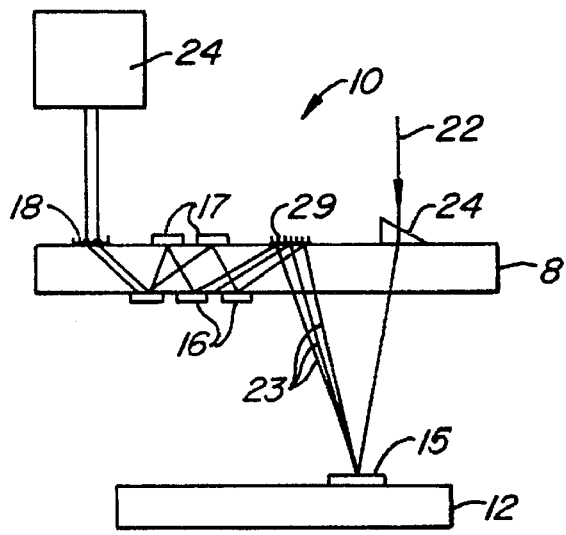

Alignment subsystem 10 is shown in FIGS. 4a and 4b. Reference laser 20 emits light within the visible spectrum, for example, a helium-neon laser (632.8 nm). Alignment beam 22 is projected toward a reflective prism 24 attached to the perimeter of FZP 8 which directs beam 22 through a clear area 7 of FZP toward a location on the circuit board 12 at which is patterned a surface relief grating 14. Note that the prism 24 projects beam 22 at a slight angle toward grating 14. This is necessary to permit the reflected beam to pass through a different location than directly back to prism 24. When beam 22 strikes grating 15 it is split into several diffracted orders which are reflected back toward the FZP array through a blocking filter 16 which filters the reflected light, removing all diffracted orders except the −1 and +1. As shown in FIG. 4b, visible light beam 22 passes through refractive prism 24 which causes beam 22 to leave Fresnel subaperture plate array 8 at an angle. Beam 22 strikes surface relief grating 14 on workpiece 12. Grating 14 breaks beam 22 into multiple diffracted orders 23. Diffracted orders 23 are reflected and focused by reflective grating lens 29. Beams 23 reflect a second time off mirrored surface 16, which is patterned to reflect +1 and −1 diffracted beams but to stop 0th and all other beams. The +1 and −1 beams encountered reflective bumps 17 on top surface of 8. Purpose of bumps 17 is that beam 22 may be scanned through small angles, causing +1 and −1 beams to move onto and off of bumps 17. As they do so, their relative phases are modulated. Beams reflect once more off of 16 and from interference pattern at plane of transmission grating 18. Proper alignment of workpiece 12 and plate 8 gives maximum signal to detector 24. Phase modulation of beams produced by bumps 17 serves to rock interference pattern back and forth, giving a modulated signal to detector 24. This modulated signal is suitable for synchronous detection which gives high accuracy and noise immunity. Mirrored surface 16 may be placed on the underside of FZP array 8 or may be a separate component. The transmission and combination of the −1 and +1 diffracted orders create interference fringes which then pass through transmission grating 18 which is preferably patterned on the perimeter of FZP array 8. Transmission grating 18 may alternately be a separate component. The light passing through the transmission grating 18 is measured at detector 24 to determine the total amount of light passed. By adjusting the rotation tilt and/or lateral movement of the FZP 8 or the stage 14 on which the circuit board 12 is mounted, the maximum intensity of light transmitted through transmission grating 18 is achieved, indicating alignment.

The above alignment procedure is preferably performed at two or more locations which may be facilitated by placing beam splitter 25 between laser 20 and reflective prism 24 to provide two separate beams 22 and 22' which impact gratings 15 and 15', respectively to permit the above-described alignment procedure at two locations.

In an alternate embodiment alignment subsystem 30, using a reference laser 20 as above, directs a reference beam through a reticle which has a set of alignment marks patterned at two of its edges. A corresponding set of alignment marks is located on the workpiece onto which reference beam is focused by the use of a Fresnel lens. The alignment marks are partially reflective, reflecting the beam back through the reticle and alignment marks thereon. A camera looks at the images carried by the reflected beam to determine whether complete overlap and, thus, alignment has been achieved.

Improved Embodiments

Figure 6:
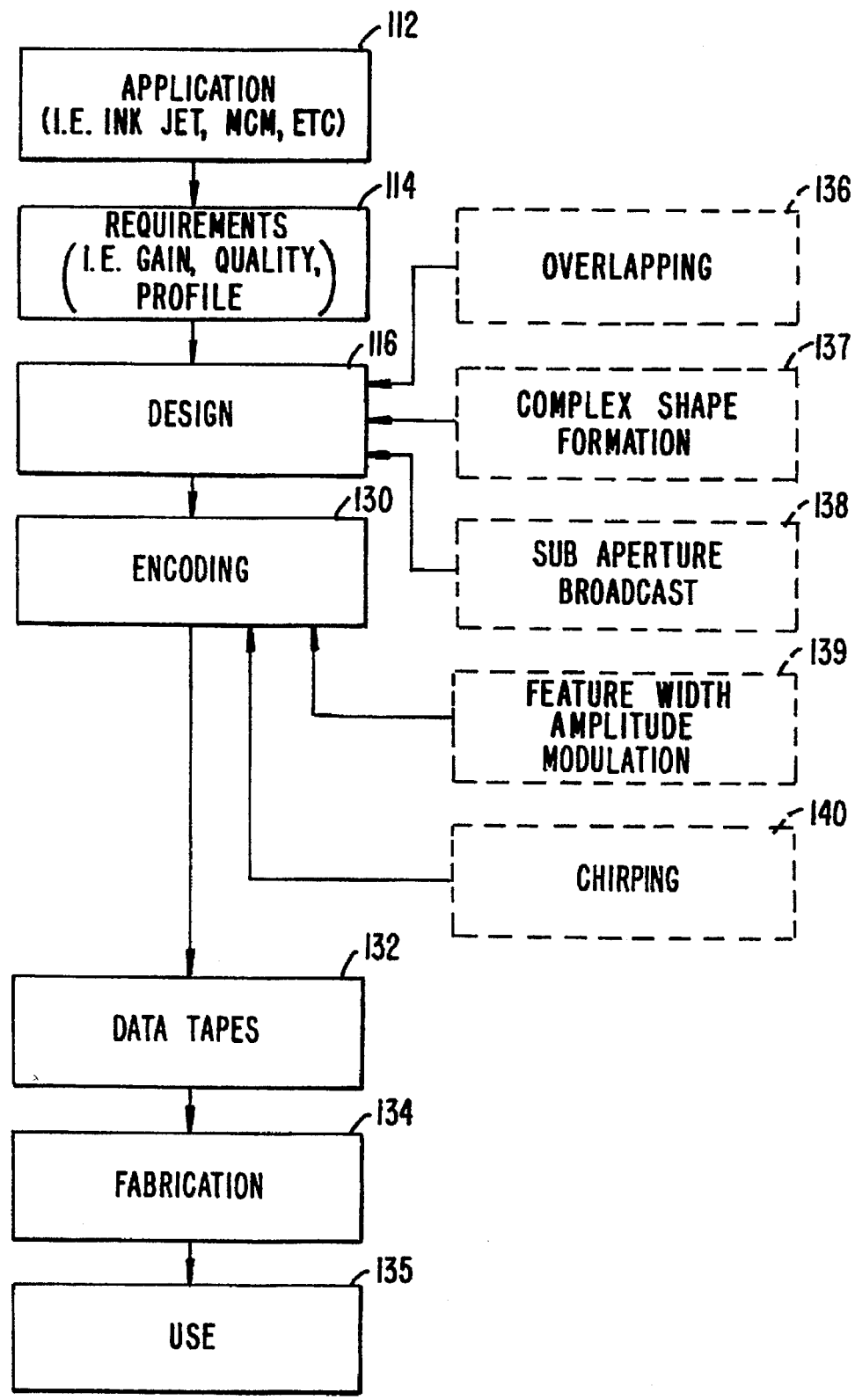
FIG. 6 is a block diagram illustrating the regular process of design, encoding and fabrication with the improvements in the encoding process being shown and designated in boxes enclosed in broken lines.

Referring to FIG. 6, the block diagram of the steps utilized in the design, encoding and fabrication of a plate is illustrated. This schematic is of the entire process from plate design through fabrication and subsequent patterning utilizing light and is given at this juncture so that the reader call fully understand the full process of plate generation as well as the applicability of the improvements set forth here.

In a decision to process a workpiece utilizing plates of this invention, the particular application 118 must be known. The reader will understand that these techniques have broad applicability. For example, the techniques here utilized can include producing so-called ink jet heads having closely spaced nozzles with precision dimensions and wall profiles for machining magnetic head air bearing sliders, forming vias (either through hole or blind) for vertical electrical interconnects.

Having chosen the application, the requirements, 119, of the projected image pattern must be determined. This can include the gain, quality (signal to noise ratio) and intensity profile required of the particular application. For example, center to center spacing, the hole dimensions, the tolerances involved in production, the coherent square properties, and the like would all be taken into account.

Figure 7:
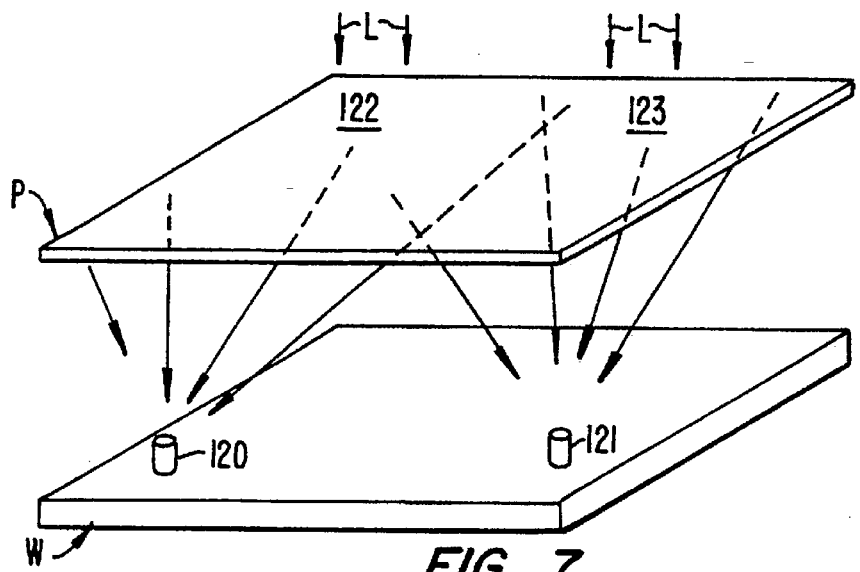
FIG. 7 is a perspective view of two subapertures on a computer generated hologram generating two images, the images here shown being three dimensional cylinders for producing either through hole or blind vias.

Turning briefly to FIG. 7, this stage of the process can be understood. In FIG. 7, it has been decided to optically machine utilizing the techniques set forth herein, two vias, including first via 120 and second via 121. Accordingly, what is illustrated at FIG. 7 are the images of vias 120, 121 that are to be created when coherent light impacts plate P overlying the respective image locations.

Assuming that a plate has been fully produced, these respective vias 120, 121 are from phase plate subapertures 122, 123. Here, each subaperture 122, 123 forms respective images 120, 121 in their entirety, but are partially overlapped or share a common part of plate P. That is if we illuminate subaperture 123 only a small portion of image 120 is created. Likewise, coherently illuminating subaperture 123 only, a small portion of image 120 is created.

It will be understood that for simplicity we illustrate only a small section of a plate with two contiguous subapertures 122, 123. It will be understood that in actual practice, many subapertures will be utilized on the same plate.

Having seen FIG. 7, return can now be made to FIG. 6. Knowing that we wish to produce images 120, 121 for the processing of a workpiece—here producing vias—we first back propagate an image of the via to the plate P. This is done almost always in and by a computer to generate a "map" of the desired phase and amplitude needed to produce the respective images 120, 121.

The information generated in such a map is relatively dense. Fortunately, this map need only be computed in very small sections, typically a square approximately 100 μm on a side. For example, the subapertures 122, 123 would be determined in phase and amplitude on a grid with spacing approximately equal to $$\frac{2}{3N}$$

of the local grating period, where N is the total number of phase levels. At this degree of resolution and for a binary mask (N=2), each pixel is about two-thirds (⅔) of the feature width. The previous assumes the local amplitude modulation is 1.0. When the local amplitude modulation is A (<1) then the sampling rate is ~1/A(>1) more frequent for a binary grating. In general, the sampling is more frequent if the amplitude modulation is <1.

Having created a local pixel map, at each pixel, the decision is made as to the depth or optical path length change to make. Interpolation may likely be involved in determining the boundary of the etch/no etch region. We can subsequently use run length encoding in whatever direction yields the greatest reduction in the total number of shapes. The result of this compression is individual primitive shapes or groups of primitive shapes that can be written by the E-beam or whatever tool is subsequently employed. This process of turning a phase and amplitude specification into primitive shapes suitable for subsequent writing is the process of encoding. Very commonly, the results of encoding step 130 is recorded on a tape 132. Later, this tape is utilized to "write" a plate. In the technique that we prefer, a standard glass plate having E-beam (electron beam) resist is "written" by an E-beam with the plate thereafter being "developed" and then etched utilizing standard, known in the art techniques for the fabrication step 134. The plates are then used.

Plate use can be understood by return to FIG. 7. Specifically, coherent light L of the wave length utilized is incident upon plate P. Utilizing the exemplary material of FIG. 7, cylinders 120, 121 for via generation result from plate use. When these respective images are registered to workpiece W, corresponding vias or holes are placed in the workpiece.

Much of what has been described in FIG. 6 is known in the prior art. In this application, we offer five improvements. These improvements are enclosed in boxes having broken lines. This has been done on FIG. 6 so that the reader may understand where the procedures outlined here find relevance.

In this disclosure, the plate design process is impacted by two sections. Specifically, the technique of "overlapping" 136 is utilized. This is where subapertures overlap, the common or shared subaperture area making contributions to the image of more than a single feature.

Secondly, it is sometimes necessary to machine complex features on a workpiece W. This being the case, transition to lines, curves, circles, as well as control of wall contour and the like is required. This is discussed under complex shape formation 137.

Third, a great simplification and increased flexibility in plate design, manufacture and efficiency is permitted by designing the plate as a subaperture broadcast computer generated hologram. Its advantages allow for wide area patterning with fewer demands on the laser than a full aperture broadcast architecture.

Fourth, it is frequently desired to control the amplitude modulation as a function of position on the plate. Such control of amplitude is discussed under a subtitle known as feature width amplitude modulation 149.

Fifth, and finally, another technique for obtaining the correct amplitude at any given position is discussed under the title of "chirping" —an acronym that we have assigned for our own convenience. Utilizing this technique of chirping 150, amplitude modulation can be obtained with a reduced number of primitive shapes. Further, this technique can be used to avoid situations where the plate design would call for optical elements or primitive shapes on the plate that have a dimension below that which can be fabricated. By way of example, suppose a plate design at a certain point requires an amplitude less than 1 resulting in a 0.5 micron feature to be made—and the minimum optical feature which can be reliably fabricated is 1 micron. By utilizing the chirping technique, feature size can be maintained to exceed 1 micron in all dimensions while the desired low amplitude is attained, provided the local grating period is $\geq 2$ µm.

Having set forth these various improvements, they will now be serially discussed.

Subaperture Broadcast

The optical tooling here disclosed consists of a subaperture broadcast computer generated hologram.

The patterning of small holes or complex shapes using light is the function of these subapertures. Ceramic circuit board materials and sheet metal are routinely drilled and cut with $CO_2$ or YAG lasers. Some sheet metals and polyimide are routinely drilled and cut with excimer lasers. Photo imageable polyimide is routinely exposed in complex patterns with mercury arc lamps. These and other applications involving complex patterning of materials with light is the subject of the present invention.

At the outset it is worth setting forth the advantages of sub-aperture broadcast (SAB) over full aperture broadcast (FAB) for wide area patterning.

Laser power requirements are reduced. For the same overall diffraction efficiency, a computer generated hologram using full aperture broadcast generally requires a minimum power level so that all imaged features appear with enough intensity. A corresponding subaperture broadcast computer generated hologram has a minimum power level requirement only in that the beam size needs to be larger than individual subapertures and have enough intensity to properly form the feature. This is because the beam in subaperture broadcast is scanned over the computer generated hologram. Consequently, the scanned beam can frequently have much less power than the full aperture beam.

A wide area may be covered by a subaperture broadcast plate at a reduced working distance. In order to remain manufacturable, a full aperture broadcast computer generated hologram which addresses a wide area requires a long working distance. This long increase makes the resulting pattern more susceptible to distortions by poor laser beam quality (beam divergence). In contrast, for a subaperture broadcast computer generated hologram to cover a wide area requires no readjustment in the working distance, only a larger plate or multiple plates arranged transversely are needed.

Designing a subaperture broadcast plate requires that only the complex amplitude required for generating a single type of feature needs to be computed. Thus an array of 1000 identical vias only requires that the complex amplitude for a single via need be calculated and then placed in multiple locations with differing tilts to produce the desired pattern. The calculation of the complex amplitude can use any convenient technique such as back propagation, Gerchburg-Saxton, simulated annealing or other known techniques. On the other hand, a full aperture broadcast computer generated hologram of this scale requires iterative calculations over the entire workpiece and computer generated hologram plane if it is to be efficient at all. Calculations of this scale are generally impracticable for arbitrary via arrangements and have only been carried out for regular arrays of vias.

Manufacturability is improved. Because of the extensive overlap required by full aperture broadcast computer generated hologram, the smallest feature size on the mask is usually present across the entire mask. That is, the distribution of features sizes over the mask is narrowly distributed around the minimum feature size on the mask. This contrasts with subaperture broadcast computer generated hologram in that the distribution of features across the mask is wider, resulting in areas having feature sizes much larger than the minimum, resulting in simpler manufacture.

Further, it is easier to size the beam with respect to the plate. For full aperture broadcast, the laser beam incident on the computer generated hologram needs to occupy most if not all of the active plate area, otherwise there is resolution loss in the projected image. In subaperture broadcast, the laser beam needs only be larger than any single subaperture on the plate resulting in optics which are only as large as the incident laser beam.

Diffraction efficiency is improved. Because of their overlap, full aperture broadcast plates generally have lower diffraction efficiency than subaperture broadcast plates.

Furthermore, and at the workpiece, high powers/fluences are necessary for machining tough materials or large areas of softer materials. Full aperture broadcast means that the entire pattern of light impressed on the material can be generated only by illuminating the entire active area of the hologram. Therefore, it can easily occur that the laser power level is insufficient for patterning the material of interest. Also, the size of the region to be patterned can be limited by the field angle of the hologram which was itself limited by the smallest feature that could be impressed in it.

It has been proposed utilizing computer generated hologram for beam scanning. In this arrangement, a computer generated hologram is encoded so that with a fixed workpiece and laser beam a one dimensional translational motion causes a focused beam to make an arbitrary trace. These computer generated holographic scanners are extensively discussed in the literature.

A shortcoming of computer generated holograms used in a tracing mode is that they are limited to doing traces in the workpiece plane, require a smooth and uninterrupted translation of the computer generated hologram, and are limited in the size of pattern they can generate by the physical limitation of impressible feature sizes on the computer generated holograms.

Reflective computer generated hologram as well as computer generated holograms for machining with a $CO_2$ laser have been utilized. Again, as discussed in the literature, they use a full aperture broadcast computer generated hologram utilizing a computationally iterative technique. Since this technique utilized full aperture broadcast, it suffered from all the previously mentioned shortcomings.

The subaperture broadcast hologram technique discussed above represents an important advance over these techniques. It can utilize a computer generated hologram consisting of separate Fresnel lenses to produce the desired light pattern. This computer generated hologram has the property that collimated light filling only part of the sculpted area of the computer generated hologram produces part of the desired pattern on the workpiece. This latter property makes it a type of subaperture broadcast hologram. With the use of a subaperture broadcast computer generated hologram, lateral scan in succession of the subapertures of a plate with a laser beam is possible.

Furthermore, a plate having differing subaperture designs has enormous flexibility in its applications to patterning. Thus a single phase and amplitude modulation defining a subaperture can have its phase varied in top and tilt, permitting the projected image to be thrown transversely or laterally to the subaperture. This simple variation in design allows for features to be patterned on a pitch or spacing less than the subaperture dimension. Other variations in subaperture design such as the ability to produce features of different size and shape are equally important aspects of our subaperture broadcast plate aperture.

For the reasons set forth above, it is important to distinguish the plates of this invention from those of the prior art. Typically, plates will have subapertures with practical limits to their F-stop or the image distance of the working image from the subaperture (which is usually—but not always the focal length of the subaperture) divided by the diameter of the subaperture. In all cases as a practical limit, this distance will exceed 5—that is the image will be at a distance that is approximately five times the diameter of the subaperture. As a practical matter, we prefer this distance to be 16 times the diameter of the subaperture. It will be understood that even higher F numbers can be utilized. Practical results can be obtained with F numbers of 50 or higher. This enables the subapertures to have minimum sensitivity to the divergence of light of the scanning beam. At the same time, the resolution of the working image is improved due to the depth of field of the beam.

At the same time, we require a practical limit to the working distance of the working image(s) from the plate containing the computer generated holograms. In the preferred case, the working distance will be from 5 to 20 centimeters. Distances up to 50 centimeters can be used with higher quality lasers. Typically, this distance cannot exceed 50 cm. Where the image is beyond this distance, working image resolution is degraded due to the divergence of light in the scanning coherent beam.

Heretofore, optical interconnects have utilized subapertures. Typically, holograms divide a light source to focus converging light on groups of optically sensitive surfaces. These interconnects are for the purpose of conveying information with absolute simultaneity.

Such optical interconnects utilize high F numbers—less than 5. Furthermore, they utilize extremely low power levels with high band widths for the usual result of conveying as much information as possible as rapidly as possible. Most importantly, these optical interconnects do not produce an irreversible effect, either by way of producing an irreversible chemical effect or any kind of machining at the workpiece. Further, optical interconnects utilize semiconductor diode lasers having power levels of 10 to 1000 milliwatts. These lower power levels are used because it is essential that such devices get away from the generation of heat. Low power consumption and high speed is preferred.

In light of the optical interconnect prior art, the subapertures of this invention may also be distinguished by the amount of fluence and power that are incident both on the plate containing the subaperture as well as the power of the working image on the workpiece. For example, the excimer lasers used here have power in the range of 10 to 100 watts or 1000 times more power than the semiconductor diode lasers in the optical interconnect prior art. Further, the power produced both at the plate and at the workpiece is quite different.

Regarding the plate and the particular subapertures being scanned, the fluence supplied by the scanning beam will in the preferred case exceed 1 millijoule per square centimeter. Likewise, the power of the scanning beam will in preferred case exceed 1 milliwatt per centimeter squared.

Further distinction may be made at the workpiece. The combination of the scanning beam and the subaperture is to produce a working image on a workpiece which produces at least an irreversible chemical or material effect (such as ablation) at the workpiece. Thus in the usual case, the working image will produce above 50 millijoules per square centimeter at the workpiece.

Frequency of the scanning beam is likewise important. Since it is preferred to have a permanent effect at the work piece, the frequency of the scanning beam is preferred to be between 1000 Å and 4000 Å. This range of light energy gives the required absorption for the machining effect here preferred.

In making this statement, we realize that some applications of industrial lasers can work with the techniques set forth herein at in the range of 10,000 Å with relatively fast F numbers. However, for the majority of the applications within the present state of the art at the time of the filing of this patent application, the above limitations are to be observed in the practice of this invention.

Carbon dioxide lasers at about 100,000 Å are good in complex patterning application—that is applications other than single point drilling, welding, brazing applications.

Having discussed the advantages of subaperture broadcast computer generated hologram, we now precisely define what is meant by a "subaperture broadcast" computer generated hologram producing "features":

Definition of a Feature

First, we clarify what is meant by the term "feature."

The effect of a computer generated hologram on a workpiece is created by the spatial distribution of the intensity profile it produces on the workpiece. The effect can be ablation, thermal action, photo exposure or etching enhancement, to name a few. Within limits, the strength of the working effect rises with increasing intensity and falls with decreasing intensity. After patterning the workpiece using the intensity profile produced with a computer generated hologram, examination of the workpiece will reveal that the desired effect can be divided up or segregated into distinct geometric regions. Any single connected geometric region where the desired effect obtains defines a feature. In the case of machining or etching, any geometrically connected through or through to etchstop region would be considered a feature. In the case of photo exposure, any geometrically connected portion of the exposed and developed resist would comprise a feature. When patterning material to a certain depth or contour, the individual features would be the geometrically connected regions that have been etched.

This definition of feature is an operational one which can be applied to the effects of an intensity profile on a workpiece. It can be applied both in practice and in discussion. Having defined a feature in terms of an effect on a workpiece, we can examine the intensity profile creating those effects. That part of the intensity profile responsible for creating a particular feature, we use synonymously with feature in the foregoing.

Definition of Subapertures

Now we define what is meant by "subaperture." In the following example, we will presume that a plate has been supplied for examination—and nothing more. The person possessed of the plate is thereafter trying to determine the plate's subapertures.

If we consider a specific feature formed by a computer generated hologram, then the subaperture creating it consists of that computer generated hologram region necessary to define the feature in shape, intensity profile and intensity level. More concretely, if we have an iris of variable size and shape, the smallest area setting of this iris that allows the feature to be completely defined in shape, intensity profile and intensity level is that feature's subaperture.

Figure 8A:
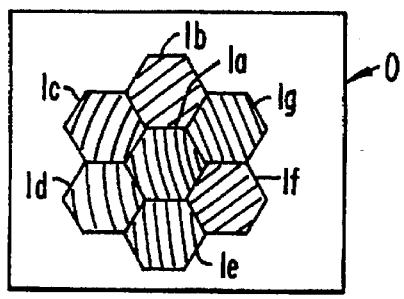
FIGS. 8A and 8B are respective subapertures on a hologram and the corresponding image array produced by the hologram.
Figure 8B:
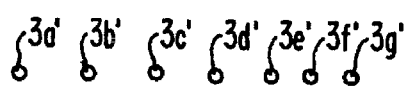

FIGS. 8A and 8B illustrate the application of this definition to an Fresnel zone plate array (FZPA) consisting of hexagonal facets. FIG. 8A is an FZPA whose subapertures consist of hexagonal facets, each facet producing a distinct intensity profile in a different location on a workpiece. FIG. 8B is the array of vias produced by the computer generated hologram of FIG. 8A, the corresponding facets 1a–1g in FIG. 8A corresponding to vias 3a'–3g' in FIG. 8B. In this case one can distinguish the subapertures by visual (microscopic) examination since they are discrete, however, in the general case they are not and we must go through the following steps to distinguish them.

Figure 9A:
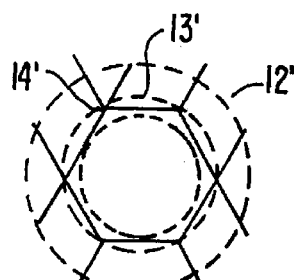
FIG. 9A is a slightly expanded view of one of the subapertures of FIG. 8A illustrating decreasing areas of impact of various beam sizes on the subaperture.
Figure 9B:
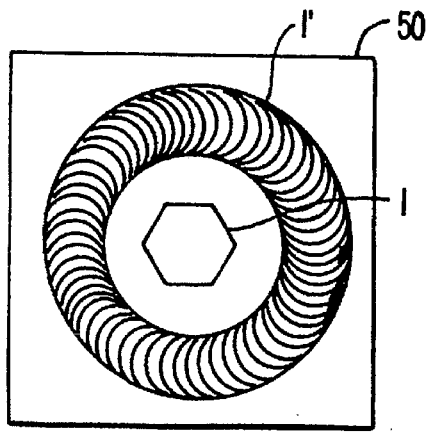
FIG. 9B is a reduced view of the subaperture of FIG. 9A showing an iris used to simulate the effect of decreasing beam impact areas.

To determine the subaperture producing via 3a', a variable iris 1' of FIG. 9B (in this case a circular one, but more general ones can be used) is translated around computer generated hologram 50 and dilated to the smallest diameter that still completely defines feature 3a'.

Figure 10:
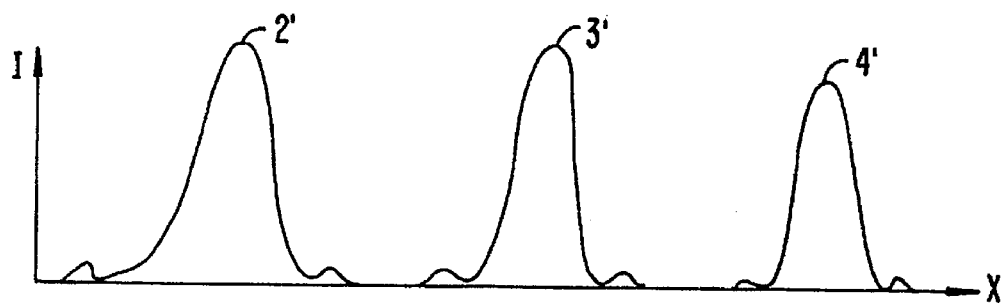
FIG. 10 is an intensity profile of an image produced by the subaperture for various beam impact areas.

Referring to FIGS. 9A, 9B and 10, at iris setting 12', the beam intensity profile is 2'; reducing it in size to 13' we get intensity profile 3', which is substantially the same as profile 2'. Reducing the iris diameter still further to 14', the intensity profile peak is diminished and the width broadened over profile 3'. Thus, the minimum iris area and location such that the feature is substantially the same as when no iris whatsoever is used, defines the subaperture of computer generated hologram 50 used to create feature 3a'.

Oftentimes when this procedure is carried out in practice, the feature definition as determined by its intensity profile will improve slightly as the iris is shrunk down to the feature's subaperture. This is because restricting the total broadcasting aperture to a single feature subaperture eliminates the light scattered from outside the subaperture which can interfere with the light forming the desired feature creating some modulation of the intensity profile.

Figure 11A:
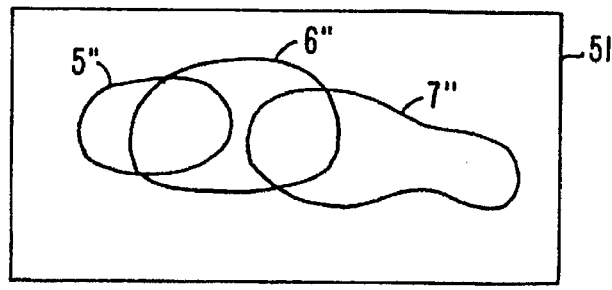
FIGS. 11A, 11B and 11C are respective related images with FIG. 11A illustrating overlapped subapertures on a computer generated hologram, FIG. 11B being a side elevation of the areas of the computer generated subaperture hologram having coherent radiation incident thereon with this radiation being focused to a corresponding workpiece having images incident thereon; and, FIG. 11C being a magnified view of the produced images.
Figure 11B:
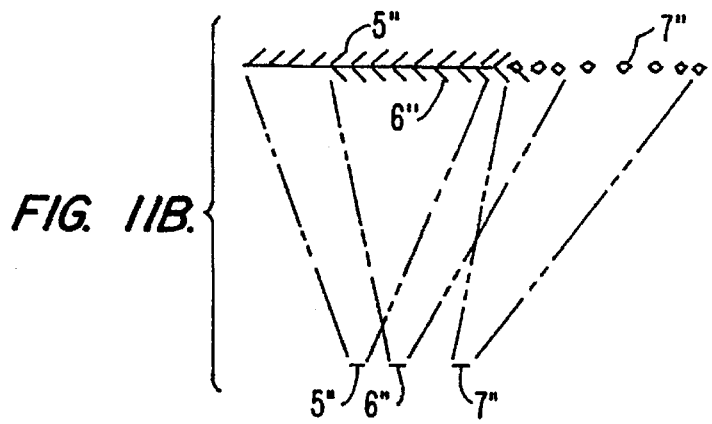
Figure 11C:
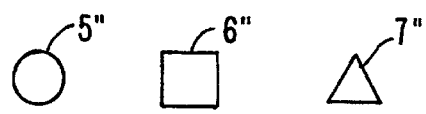

When carried out in principle, the iris can take on any size or shape, appropriate. In FIG. 11A, a computer generated hologram, 51, produces 3 features, a circle (5"), a square (6"), and a triangle (7") of FIG. 11C. The subapertures creating each of these features is illustrated in FIG. 11A and are labeled with corresponding numbers 5", 6" and 7". FIG. 11B is a side view of this broadcast arrangement. By design, the subapertures creating the shapes are not circular but somewhat irregular in shape. So, the conclusion from an experimental determination of the subapertures using a circular iris would be that they consisted of the smallest circles circumscribing the subapertures of FIG. 11A. These experimentally determined subapertures are an approximation to the true subapertures; further experiments could refine the boundaries of the subapertures of FIG. 11A.

Figure 12:
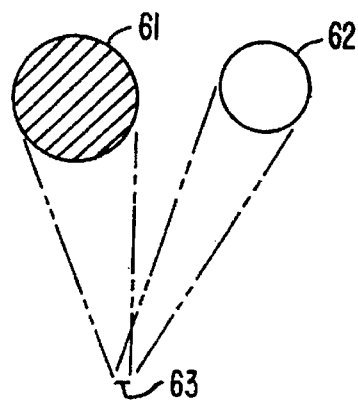
FIG. 12 is a representation of a disconnected subaperture producing an image.
Figure 13:
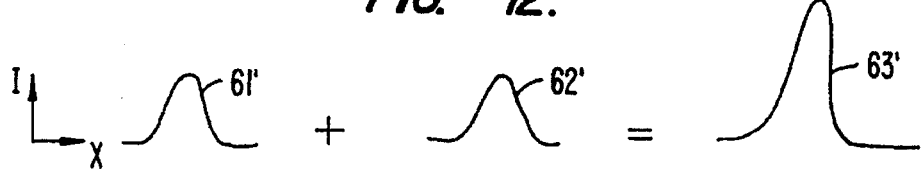
FIG. 13 is an intensity profile of the two images of FIG. 12.

It will be noted that the subapertures can consist of disjoint pieces. In FIG. 12, two discrete regions (61 and 62) make intensity profiles 61' and 62' of (FIG. 13) each of which is of the desired shape, but half the desired intensity. When they are simultaneously illuminated, then the net intensity profile (63' of FIG. 13) is twice as large, but the shape is unchanged. This sort of incoherent combination occurs when the interference terms produced by regions 61 and 62 are washed out due to angular beam divergence, or beam quality, of the coherent source illuminating them. In this example, the subaperture producing feature 63 is the union of regions 61 and 62.

Still another example of a disjointed subaperture is illustrated by FIG. 14. There, the shaded regions 74 all contribute coherently to create a single circular spot (not shown). Omitting any single subregion of this subaperture reduces the desired intensity profile either in intensity, shape or both. Again, the subaperture responsible for creating the feature is the union of the shaded regions of FIG. 14.

Figure 15A:
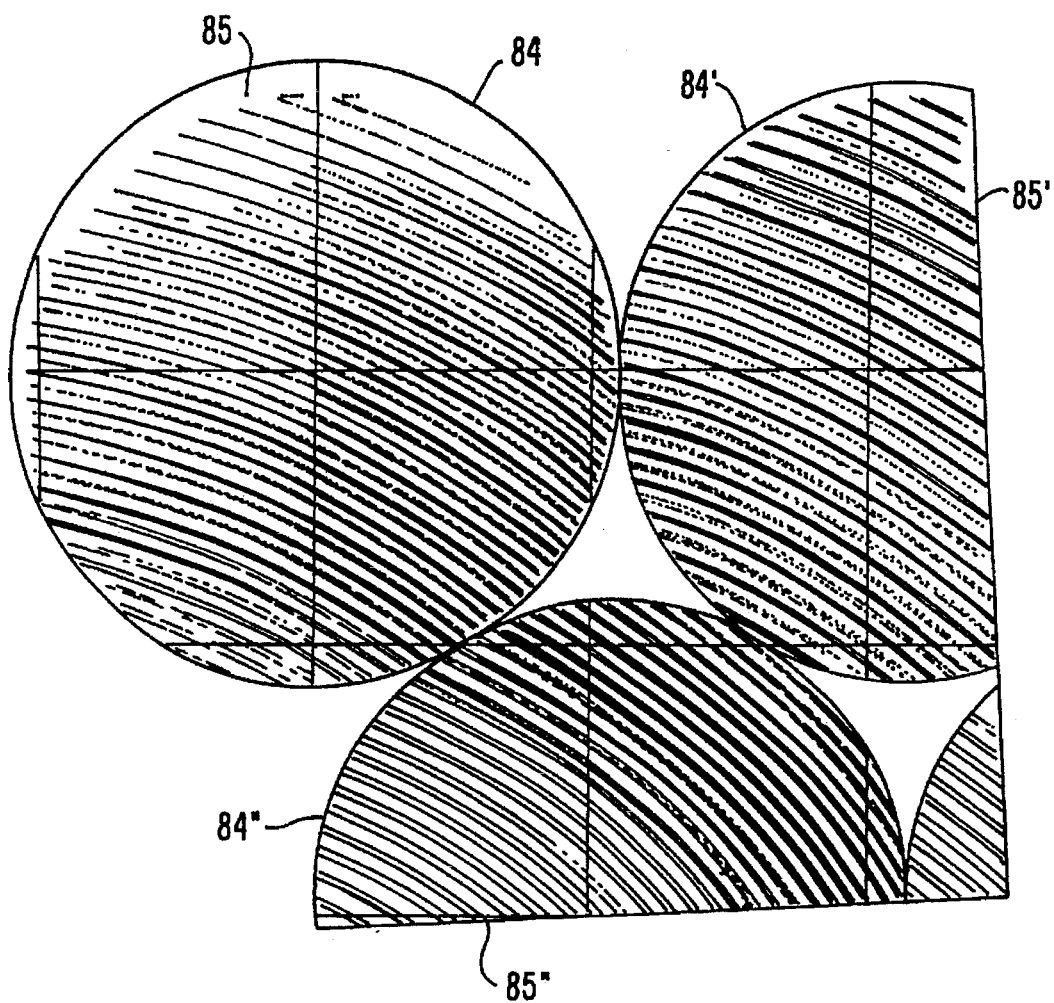
FIGS. 15A, 15B and 15C are respective images of separate, slightly overlapped and strongly overlapped subapertures.
Figure 15A:
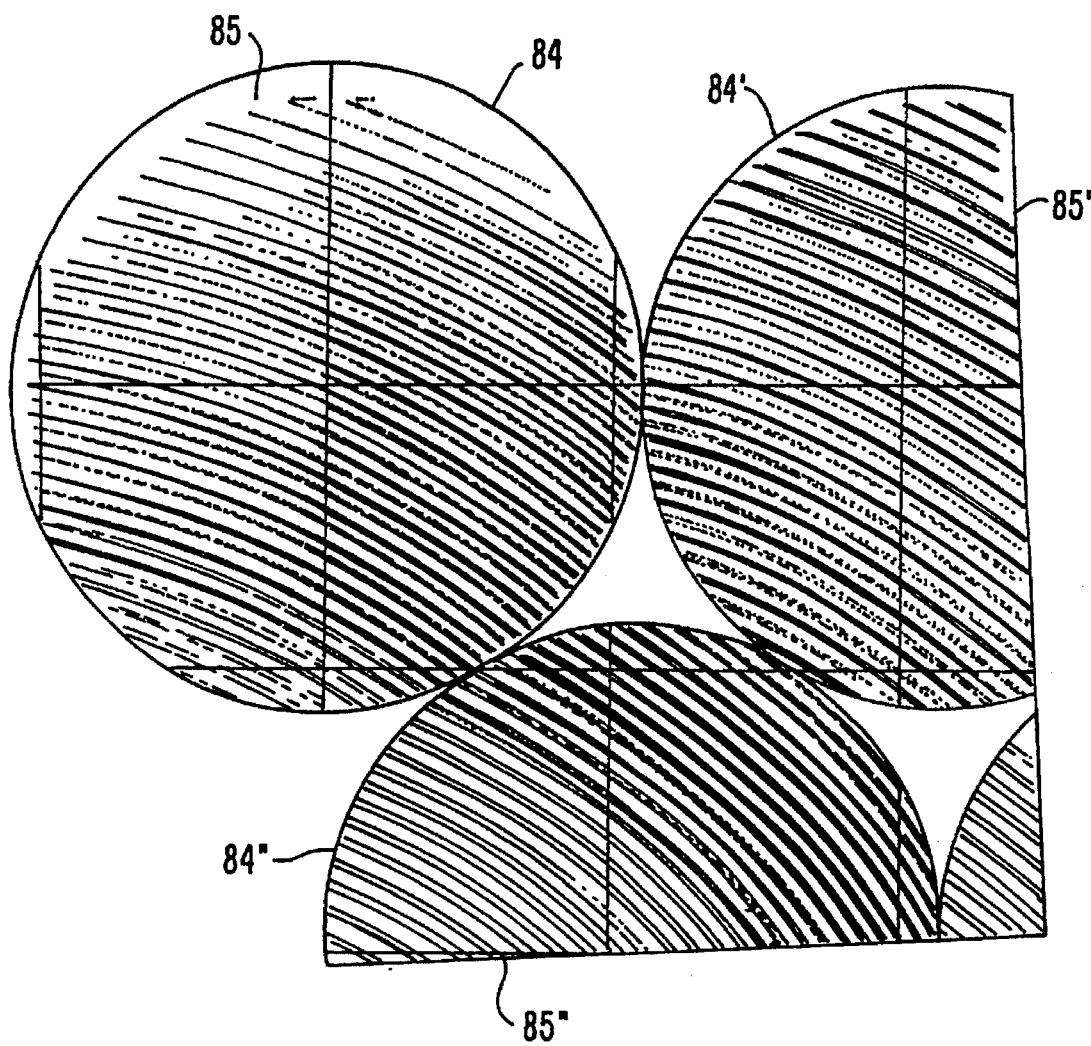

FIG. 15A is an example of a portion of a subaperture broadcast computer generated hologram consisting of Fresnel lenses. In this case, the subapertures are distinct and separate. Circle 84 bounds a single subaperture 85. Because the subapertures do not overlap in any way, if the entire computer generated hologramplane is blocked out except for circle 84, only a single, full feature will appear on the workpiece surface upon coherent illumination. No parts of any other feature will appear. The two subapertures adjacent to 85 are 85' and 85" and the respective circles delineating them are 84' and 84".

Figure 15B:
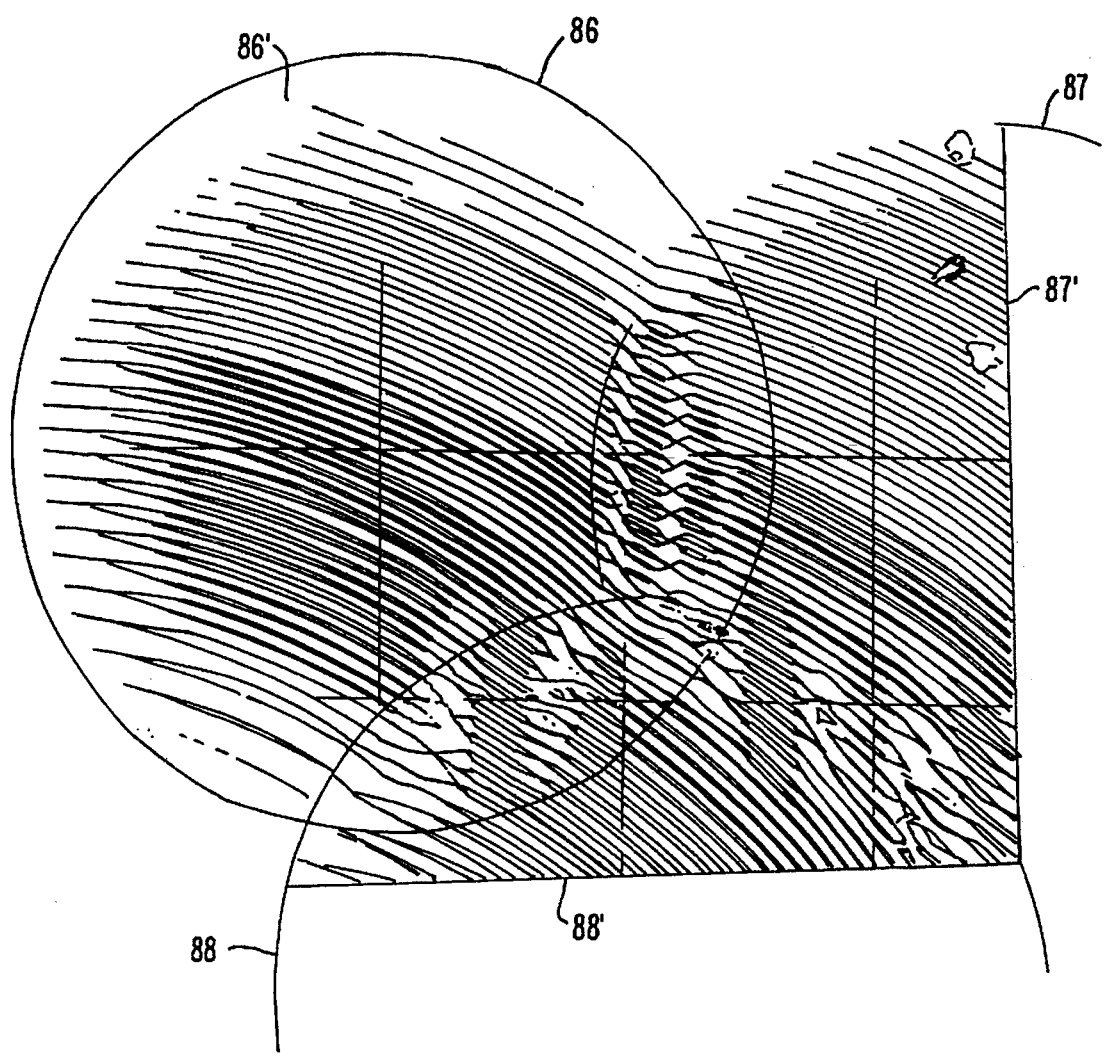

FIG. 15B is a portion of a subaperture broadcast computer generated hologram consisting of slightly overlapped elements. Circle 86 bounds subaperture 86'. While slightly larger than the smallest circle circumscribing the subaperture, it nevertheless shares the property with it that obscuring all of the computer generated hologram except circle 86 and coherently illuminating it, produces one feature in its entirety and parts of other features. This is because neighboring subapertures 87' and 88' overlap subaperture 86'. This is indicated by the overlap of the circles 87 and 88, which bound their respective subaperture, with circle 86.

Figure 15C:
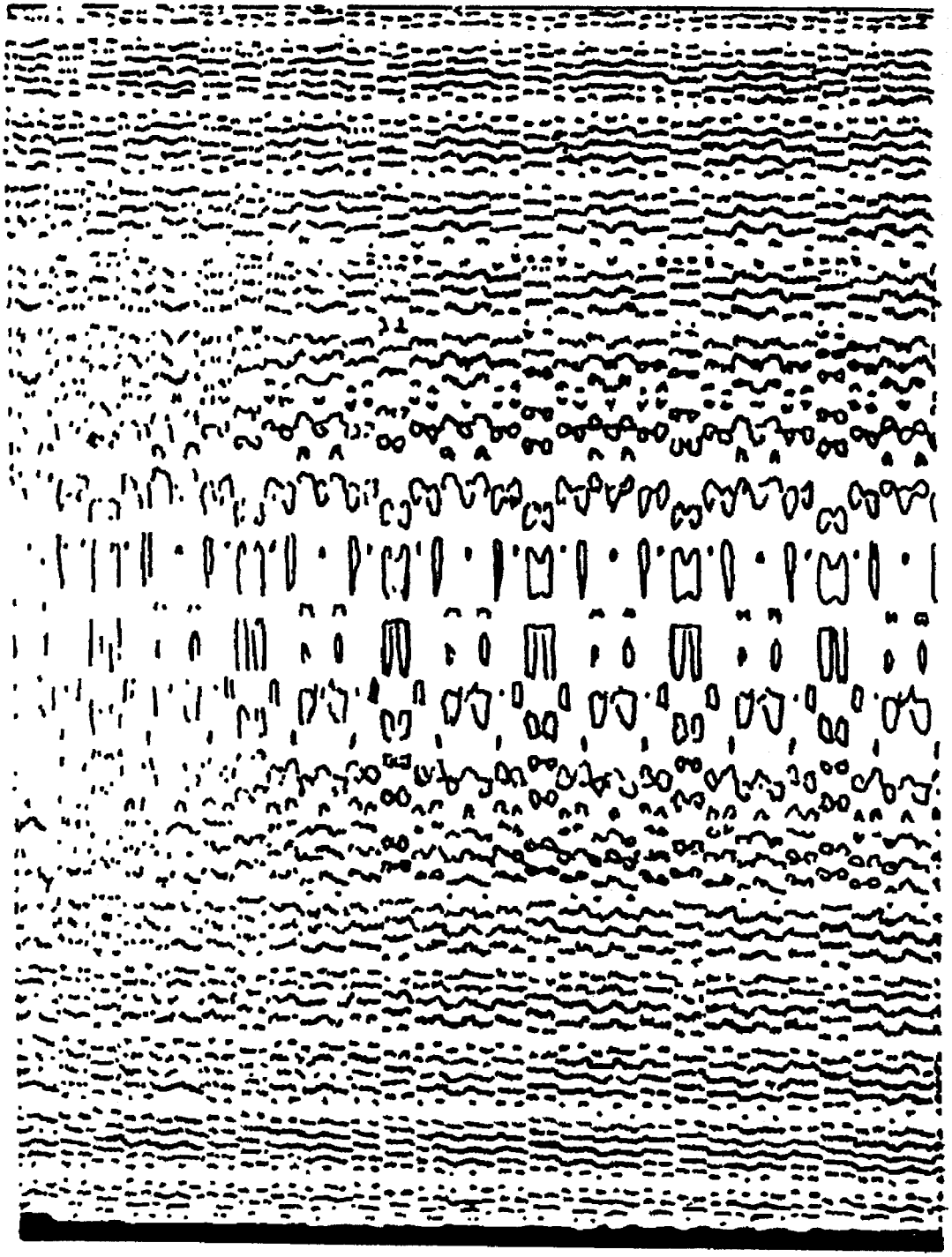

FIG. 15C is a portion (<0.02%) of a subaperture broadcast computer generated hologram consisting of strongly overlapped subapertures. In this instance the individual subapertures cannot be visually distinguished. Application of the procedure for experimentally determining subapertures would reveal the individual subaperture areas as being <0.02% of the entire array area. This photo contains, in whole or in part, approximately 35 subapertures out of a total of 120,000+ on the plate.

Definition of Subaperture Broadcast Computer Generated Hologram

Having operationally defined the subaperture responsible for generating a given feature, we now define what is meant by a subaperture broadcast computer generated hologram. A subaperture broadcast computer generated hologram is any computer generated hologram in which the area of the smallest subaperture is less than 51% of the total active area. Total active area is simply the union of all subapertures making up the computer generated hologram.

An example of full aperture broadcast (not subaperture broadcast) is given by FIGS. 16A and 16B. FIG. 16A is a plan view of computer generated hologram 92, which broadcasts two features (89 and 90 of FIG. 16B) from subapertures 89' and 90'. The two subapertures, each of which produces one feature, coincide; so this is a full aperture broadcast (FAB) computer generated hologram. FIG. 16B is a side view of computer generated hologram 92 when coherently illuminated. Common subaperture 91 has rays 93 directed at features 89 and 90 are formed by the action of computer generated hologram 92 when illuminated with coherent ray bundle 94.

FIG. 17 shows another computer generated hologram, 45, which produces three features using the subapertures 26, 27, and 28. In this case, the fact that the subapertures do not completely overlap is quite clear; it is not a full aperture broadcast computer generated hologram. However, it does not fall under our definition of a subaperture broadcast computer generated hologram, since no single subaperture represents less that 51% of the union of the three circles 26, 27, 28. This example illustrates how our operational definition of subaperture broadcast clearly distinguished itself from a full aperture broadcast computer generated hologram. Thus, a situation where the subapertures overlap almost but not completely and would be difficult to distinguish from a full aperture broadcast arrangement is avoided.

FIG. 18 is a plan view of another computer generated hologram, 49. Its active subapertures 31, 32, 33 and 34, taken together constitute a subaperture broadcast computer generated hologram, since the area of subaperture 34 is less than 51% of the area of the union of circles 31, 32, 33 and 34.

Another plan view of a subaperture broadcast computer generated hologram is given by FIG. 19. It creates 5 features, one from each of subapertures 35, 36, 37, 38, and 39. Subaperture 35 overlaps all of the other subapertures, subapertures 36 and 37 coincide and subapertures 38 and 39 partially overlap. This is a subaperture broadcast computer generated hologram because any of the subapertures 36, 37, 38, 39 are less than 51% of the total area of the union of the area of 35.

Having set forth the definition of a subaperture broadcast hologram, attention can now be devoted to design of such a hologram.

Designing the computer generated hologram starts by dividing the pattern to be made into features, each of which will be formed by a subaperture of the computer generated hologram.

Figure 20:
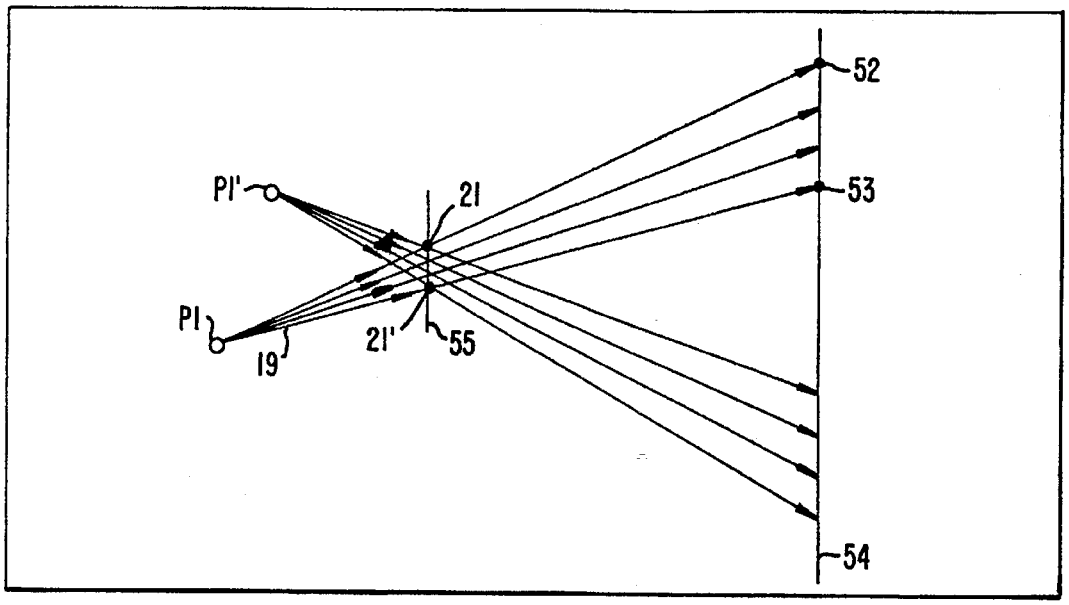
FIG. 20 is a schematic diagram illustrating the creation of two subapertures on a plate illustrating imaginary back propagation from a point source through a feature on a workpiece to a plate of the phase and amplitude desired on the workpiece.
Figure 21A:
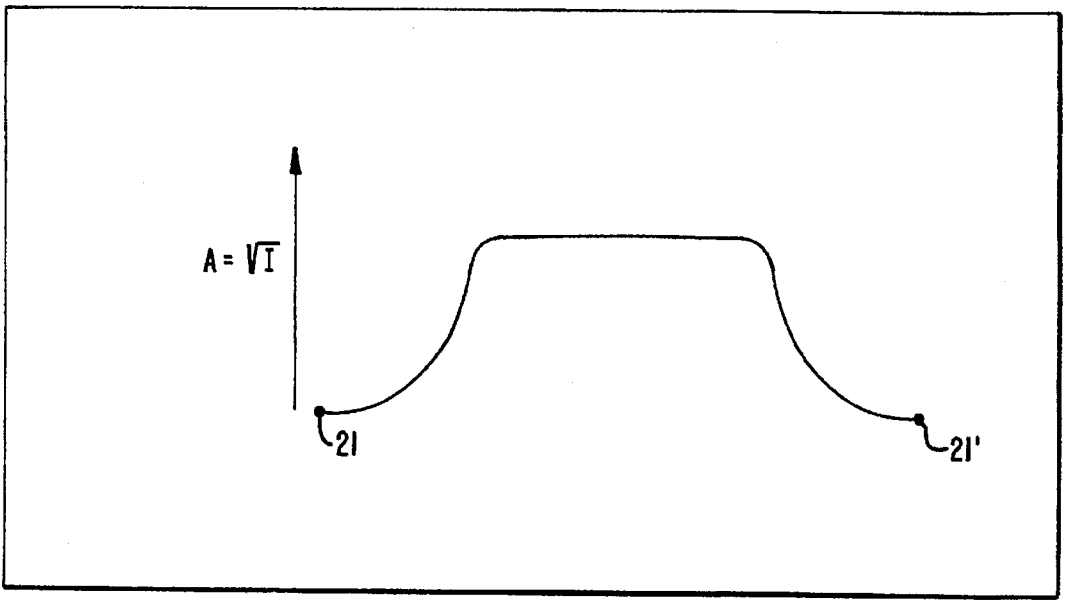
FIG. 21A is a graphical representation of amplitude produced at the workpiece with the profile shown having the capability of generating relatively steep hole walls during an ablation process.
Figure 21B:
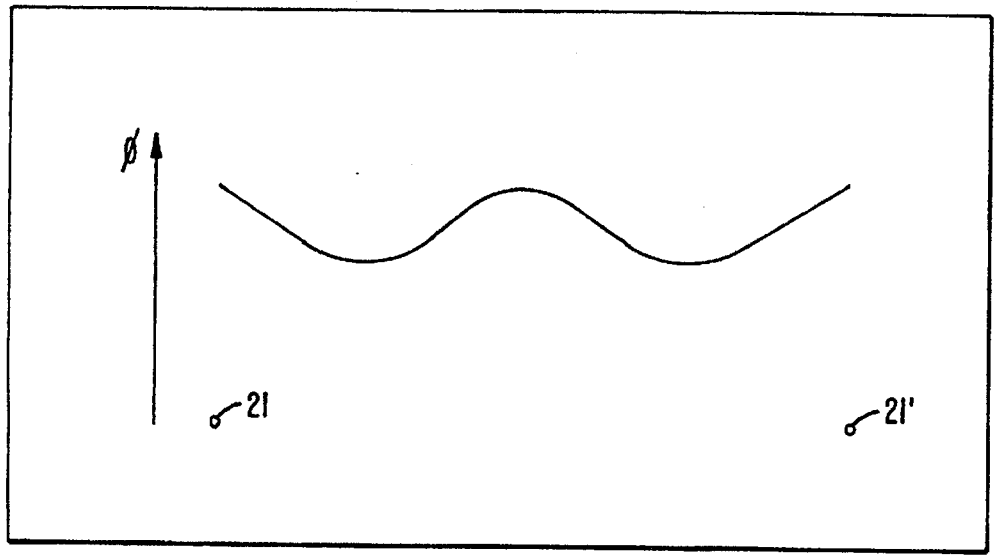
FIG. 21B is a graphical representation of phase at the workpiece between two points on the workpiece.

Referring to FIG. 20, on the workpiece surface 55, we require an intensity profile, I, and phase profile, φ, these respective profiles being sketched in FIGS. 21A, 21B.

Referring further to FIG. 20, when a working image containing an intensity profile is registered to a workpiece, the intensity profile determines the feature shape and the phase profile the shape and size of the subaperture 52–53 in the diffractive optical element plane. An imaginary point source P1 located a distance f from diffractive optical element surface 54 passing through the workpiece plane and being modulated in phase and amplitude producing an electric field, E, in the diffractive optical element plane 54 given by:

$$E(\bar{x}) = \int d^2 y \, e^{ik\sqrt{((\bar{x}-\bar{y})^2+z^2)} \, -ik\sqrt{((\bar{y}-\overline{P1})^2+(f-z)^2)}} * A(\bar{y}) \, e^{i\phi(\bar{y})} \quad (40)$$

where the following symbols take on the meanings:

$\bar{y}$ is the transverse coordinate in the workpiece plane, $k=2\pi/\lambda$ where $\lambda$ is the coherent source wavelength, Z is the hologram to workpiece distance, $\bar{x}$ is the transverse position in the CGH plane, $\overline{P1}$ is the transverse position of imaginary point source P1, $A(\bar{y})$ is the desired amplitude profile in the work piece plane, $\phi(\bar{y})$ is the desired additional phase profile desired in the workpiece plane.

Normalizing equation 14 so the maximum value of |E|=1, the amplitude, A', and phase, φ', modulation required of diffractive optical element 24 are then given by:

$$A'(\bar{x})e^{i\phi'(\bar{x})} = E^*(\bar{x}) \quad (41)$$

where * denotes complex conjugation. In the geometric optic approximation the gain (G) or enhancement in intensity is just the ratio of areas of the projected pattern 52–53 in the diffractive optical element (54) plane to the area of the feature, 21–21', in the workpiece plane times the diffraction efficiency of the computer generated hologram. If diffractive effects are significant, we must use equation 40 in place of the above considerations. In either case, the gain is varied by adjusting the distance of point source P1 from the workpiece plane 55.

Strictly speaking, the wave front on the diffractive optical element as determined by any one feature extends over the entire diffractive optical element plane. In practice, since the amplitude of the return wave front decreases rapidly outside the region illuminated in the geometric optics approximation, 52–53, we can use as a boundary a line just inside the geometric shadow region to delineate the region in the diffractive optical element plane occupied by a given shape. This boundary defines the subaperture. We can then use a computer-aided design program which allows the geometric shapes corresponding to the back propagated wave to be arranged so that regions in the diffractive optical element plane corresponding to different features are, as much as possible, non-overlapping. To change the position of a feature in the diffractive optical element plane 54, the lateral position of the point source P1 is shifted. As illustrated in FIG. 20 laterally shifting the position of P1 to P1' we shift the position of the subaperture that creates the feature 21–21'. The phase and amplitude to be encoded on the diffractive optical element 54, are determined by equations 14 and 15. If it should happen that we cannot separate the geometrically illuminated region of two or more shapes because of fabrication feature size limitations or other constraints, the resulting back propagated wave fronts can be partially or fully overlapped but their individually geometrically illuminated regions must be increased to account for the splitting up of the incident light into more than a single direction.

The foregoing is a simple and direct method for computer generated hologram design as it involves no large scale iterative calculations and as such it is a suitable procedure for generating the data required for large patterns. However, if the pattern is sufficiently small, its parts may be optimized by iterative procedures such as simulated annealing M. S. Kim, M. R. Feldman, C. C. Guest, "Optimum Encoding of Binary Phase only Filters with Simulated Annealing Algorithms", *Optics Letters* (1989) Vol. 14, pp. 545–547, J. R. or Gerchberg-Saxton Fienup, "Reconstruction and synthesis applications of an iterative algorithm", *SPIE* Vol. 373, pg. 147. The other advantage of this technique is that because it uses subaperture broadcast of the features, the gain is easily controlled because it is uncoupled from the gain of other features.

For concreteness we have described the phase and amplitude encoding as determined by a point source. Line sources consisting of straight or curved line segments, planes or portions of planes in arbitrary orientations, spheres portions of spheres arbitrary orientations and more general sources can also be used in a completely analogous fashion.

Some attention is now devoted to the subaperture configured in a plate.

Relative to the size of the subaperture, the scanning beam generally needs to be bigger than the smallest subaperture size. While in limited situations (for example the formation of lines on the workpiece), such expansion is not always necessary.

Apart from the size of the scanning beam, it is advantageous to have the subaperture itself as small as possible. This takes the subaperture and the image it produces away from the disadvantages of full aperture broadcast discussed above.

It will be understood that we are here concerned with machining or otherwise processing the surface of the workpiece. Accordingly the minimum fluence (energy per unit area) or intensity (power per unit area) must be sufficient for obtaining an effect on the workpiece. For example, where the workpiece is of polyimide, utilizing a KrF laser, more than 70 millijoules per square centimeter is required to have any effect whatsoever; 1000 millijoules/cm$^2$ is preferred. This may be contrasted with the processing of stainless steel where a minimum fluence in the range from 3 to 10 joules per square centimeter is required.

The plate, and more importantly the primitive features impressed upon or in the plate must withstand the incident fluence. Accordingly, we utilize transmissive plates which alter the passing wave fronts.

We include in this invention reflective elements. Over transmissive elements they are generally not preferred because of opto-mechanical complications, and less ability to withstand high fluences/powers. However, such reflective optical elements do enjoy the full advantages of the subaperture broadcast invention herein set forth.

In general, the working frequency of the laser will be in the range of 0.6 microns or less. Certain other lasers having longer frequencies are suitable. For example Nd:YAG, Nd:YLF, (including higher harmonics of both such lasers) can be used with this subaperture broadcast technique. These lasers have frequencies from 0.2 microns to 1.3 microns; $CO_2$ lasers at 10 microns may also be suitable—although the generally longer wave lengths can adversely effect the resolution attained.

It is the purpose of this invention to avoid the use contact masks overlying a workpiece for control of the hole size and definition on the workpiece. It is to be understood that such "contact masks" are known and prior art to this disclosure. We do however, use contact or proximity transmission masks to grossly control the diffraction order of interest broadcast by the plate. For example, masks at some distance from, or in contact with, the workpiece can be used to block the "noise" of the second, third and fourth orders where the first order is the order of interest producing the working image at the workpiece.

Regarding the pulse length of laser, this pulse length is usually short enough so that sufficient peak power is realized when performing ablation, but long enough that the coherent source has sufficiently low beam divergence.

Chromatic effects are present—especially with increasing subaperture size. Simply stated, when the subaperture size expands, the image from the plate approaches that image produced by a full aperture broadcast hologram—and incorporates the disadvantages of the hologram which is one purpose of this invention to avoid. Chromatic effects increase as:

$$T \propto \Delta \lambda / \lambda$$

$\lambda$ is the wavelength of the coherent source, $\Delta \lambda$ is the bandwidth of the coherent source, T is the transverse throw distance.

Some attention must be devoted to the quality of the laser utilized. We avoid lasers having high divergence and generally prefer beams with as little beam divergence and as much focusability as can reasonably be achieved. It will be understood that this technique can use beam expanding or contracting optics dependent upon the particular instrument design utilized.

In particular, unstable resonators are preferred as the optical cavity architecture for excimer lasers since they are known to produce light of low divergence and high power, e.g., high brightness. The use of unstable resonators is especially important with excimer lasers (such as KrF) because of their relatively short pulse lengths.

For the subaperture broadcast technique here disclosed, we attempt to maintain a high efficiency of optical conversion of wave front incident upon the plate to produce with maximum efficiency a working image having high energy at the workpiece. Consequently, large plate areas in the subapertures having low amplitude modulation are to be avoided where design permits. Amplitude modulation is kept as high as possible as a general rule.

It should be understood that a particular case of back propagation is out of focus or Fresnel transforms. The originally filed application only mentions arrays where the plate to workpiece distance is equal to the focal length of the individual element. Therefore, if an arbitrary shape is desired, in the workpiece plane the resulting phase and amplitude modulation on the subaperture is determined by the Fourier transform of the desired shape. Mathematically, the FZPA modulation is proportional to:

$$\int d^2x \, e^{ik\sqrt{(\bar{x}-\bar{y})^2+z^2} - ik\sqrt{x^2+z^2}} S(x) \tag{1}$$

where z is the working distance, S(x) is proportional to the complex amplitude profile desired on the workpiece and all other symbols take their prior meanings. Equation (1) reduces to the Fourier transform of the complex amplitude profile in the paraxial approximation.

Fresnel zone plate subapertures are not limited to having their focal length equal to their working distance, in fact the working distance and focal length can be separately varied. In this case, the desired feature amplitude, S(x), is related to the Fresnel zone plate subaperture phase and amplitude modulation by:

$$\int d^2x \, e^{ik\sqrt{(\bar{x}-\bar{y})^2+z^2} - iksf\sqrt{x^2+f^2}} S(x) \tag{2}$$

where f is the focal length, sf its sign and all other symbols take their prior meanings. In the paraxial propagation limit, equation (2) becomes the Fresnel transform of S(x).

Feature Width Amplitude Modulation

In an article entitled *Binary Synthetic Holograms* by Wai-Hon Lee published July 1974 in Volume 13, No. 7 of Applied Optics, the position and width of the fringes in a binary synthetic hologram are determined as a function of the local phase ($\phi$) and amplitude (A). We propose a modification to this technique which generalizes it to CGH's having more than two levels.

The starting point is the known encoding technique for binary phase diffractive optical elements. The formula determining the phase to be applied is:

$$\Phi_2(\phi,A) = \begin{cases} \pi & |\phi| \geq \pi - \sin^{-1}(A) \\ 0 & |\phi| < \pi - \sin^{-1}(A) \end{cases} \tag{3}$$

where $\Phi_2$ is the binary diffractive optical element phase, and $\phi$/A the respective phase/amplitude modulation we wish to apply to the incident laser beam. A is the amplitude relative to the maximum (=2/$\pi$ into the +1 order) and takes on values in the range 0–1. $\phi$ is the phase modulation and is in the range $-\pi$ to $\pi$. $\Phi_2$ is binary valued, the possibilities being 0 or $\pi$.

Figure 22A:
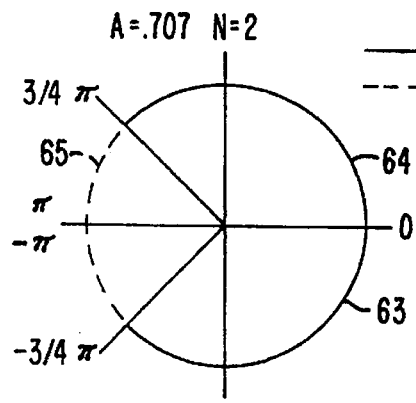
FIGS. 22A, 22B and 22C represent prior art two level gratings, the gratings here shown being controlled in amplitude to 0.707 of a maximum nominal amplitude of unity with FIG. 22A illustrating a phase level convention that we utilize hereafter for description of the preferred embodiment, and FIGS. 22B and 22C illustrating respective plan view and sections of the prior art grating.
Figure 22B:
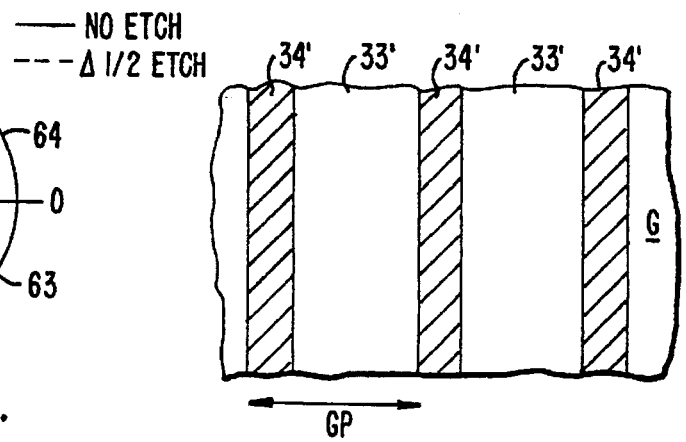
Figure 22C:
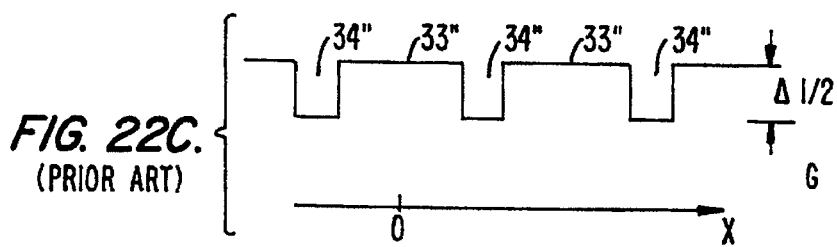

The graphical interpretation of eq. (1) is provided by FIG. 22A. In the example of FIGS. 22A–22C, a binary grating has its amplitude reduced to 0.707 (one over the square root of 2 —a value chosen for convenience).

The phase $\phi$ is represented by a point on the circle in FIG. 22A at an angle equal to $\phi$. The binary mask phase, $\Phi_2$, is equal to 0 if $\phi$ is anywhere on the arc 63–64 which passes through 0 and is equal to $\pi$ otherwise. The boundary between the two regions is determined by the angle $\theta$=arcsin (A) as indicated in FIG. 22A. Thus, when the amplitude A<1, the gratings change from 50%/50% etched/unetched to a different proportion. As those having skill in the art are aware, equal etched and unetched regions equate to an amplitude of one or unity for the binary system here illustrated.

For the illustrated amplitude of 0.707, etching will occur at 34' or about a 25% duty cycle over a grating period (GP). See FIG. 22B. This will result in the prior art grating set forth in FIG. 22C.

It will be seen that the material here utilized is a preferred binary transparent grating G. The grating has the effect of retarding the wavefront by ½ wave length $\lambda$ in the etched portion 34" and maintain phase in the unetched portion 33".

The generalization of the above technique constitutes our improvement. Specifically, and generalizing this technique to three levels yields:

$$\Phi_3(\phi,A) = \begin{cases} \frac{2}{3}\pi & \phi > \frac{\pi}{3} + \theta \\ -\frac{2}{3}\pi & \phi < -\left(\frac{\pi}{3} + \theta\right) \\ 0 & \text{otherwise} \end{cases} \tag{4}$$

$$\theta = \cos^{-1}\left(\frac{3}{2}A - \frac{1}{2}\right) \quad \text{range} = 0 - \frac{2}{3}\pi \tag{5}$$

Here the meaning of symbols is similar to equation (3), $\Phi_3$ now represents the three valued phase of a 3 level mask.

Figure 23A:
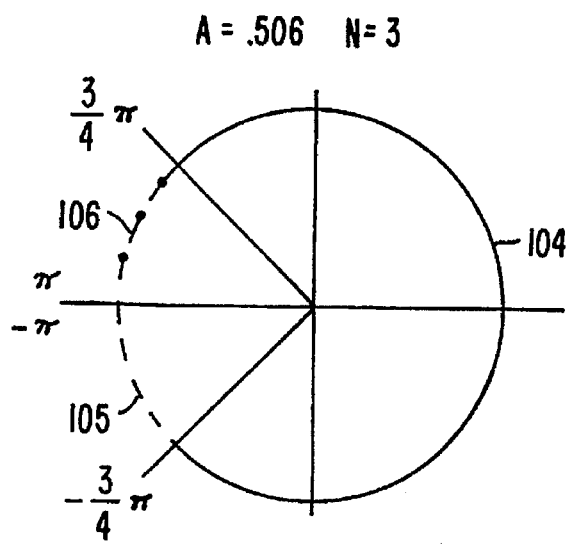
FIGS. 23A, 23B and 23C are three level gratings, the gratings here shown being controlled in amplitude to 0.506 of a maximum nominal amplitude of unity with FIG. 23A illustrating the phase level convention, and FIGS. 23B and 23C illustrating respective plan view and sections of the grating.
Figure 23B:
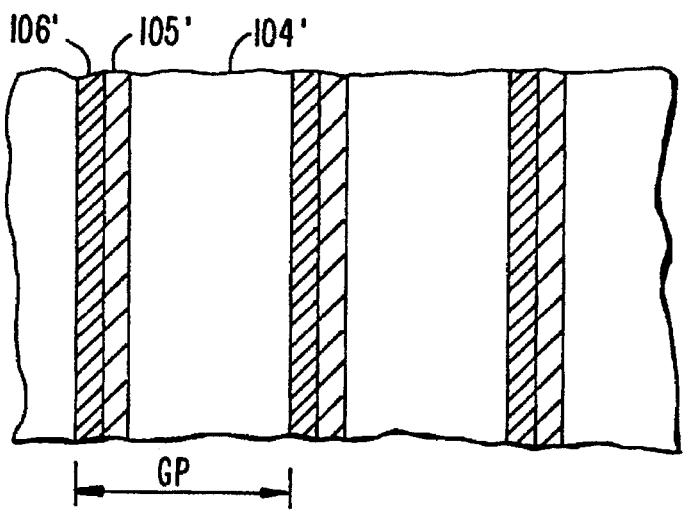
Figure 23C:
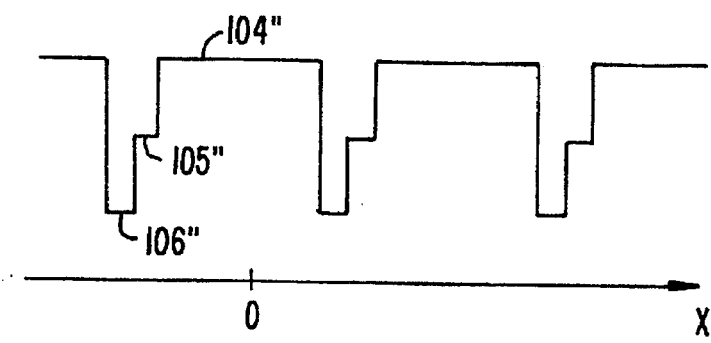

Referring to FIGS. 23A–23C, an illustration of the patterns produced by the above equation can be seen. Presuming that an amplitude of A=0.506 is desired, a phase diagram is shown in FIG. 23A. Where the value of phase is resident on arc 104 no etching occurs. Where the value of phase is resident in the arcs 105 or 106, etching to a different depth occurs. The result is that of the total grating period GP, the area of no etch 104' exceeds the area of respective etches 105', 106'—with each of areas 105', 106' having about ⅛ of a duty cycle of the total grating period GP. As can be seen in FIG. 23C, 104" is ¾ of a grating period, 105" ⅛ of a grating period and 106" ⅛ of a grating period. As the amplitude decreases, so the called for width of the respective arcs 105, 106, and steps 105" and 106" will likewise decrease.

Figure 24A:
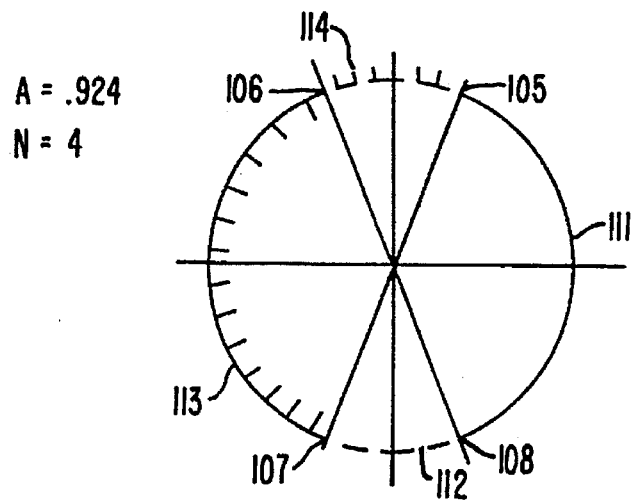
FIGS. 24A, 24B and 24C are four level gratings, the gratings here shown being controlled in amplitude to 0.924 of a maximum nominal amplitude of unity with FIG. 24A illustrating a phase level convention that we utilized hereafter for description of the preferred embodiment, and FIGS. 24B and 24C illustrating respective plan view and sections of the grating.
Figure 24B:
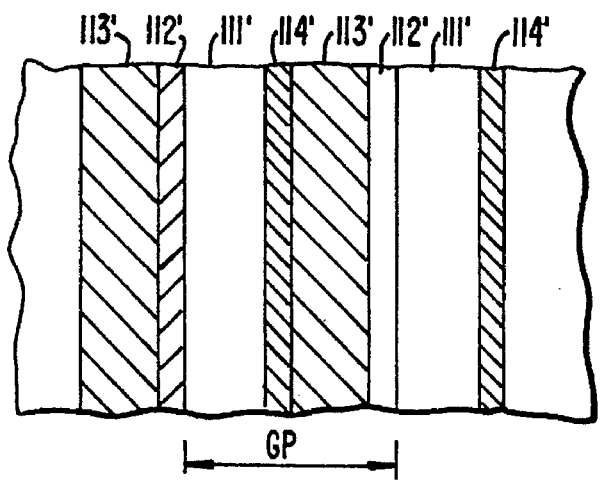
Figure 24C:
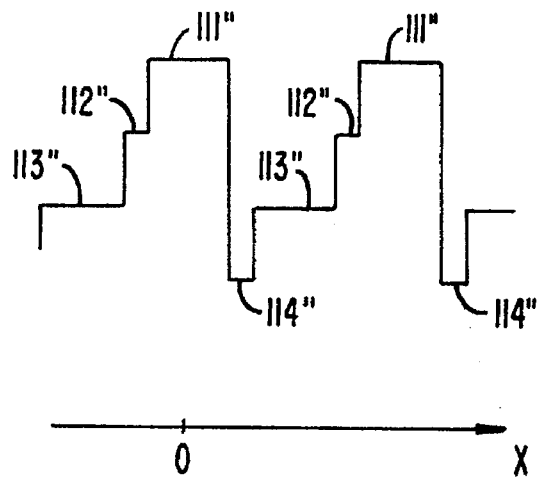

The generalization of equation (3) to 4 levels is illustrated by FIGS. 24A–24C. With angle $\theta$=arcsin(A) $-\pi/4$, and $\phi$ represented as a point on the circle of FIG. 24A, the 4 level encoded phase, $\Phi_4$, takes the value 0 if $\phi$ is in the angular interval 111 (105–108), $\pi/2$ for $\phi$ in the interval 114 (105–106), $\pi$ for $\phi$ in the interval 113 (106–107), and $-\pi/2$ for $\phi$ in the interval 112 (107–108). This is the prescription when the amplitude $$A \text{ is} > \frac{1}{\sqrt{2}},$$

here illustrated at A=0.924.

This results in etched areas 111', 112', 113', 114', as set forth in FIG. 24B. As there are respectively ¼ wave length optical path differences, the grating looks in section similar to that shown in FIG. 24C.

It should be understood that N=4 is preferred to N=3. This is because it requires the same number of process steps to fabricate a four level grating as the illustrated 3 level grating of FIGS. 23A–23C.

In regions where $$A < \frac{1}{\sqrt{2}}$$

the diffractive optical element only has 2 phase levels and the encoding prescription is:

$$\Phi_4(\phi,A) = \Phi_2(\phi,\sqrt{2}A) \tag{6}$$

where $\Phi_2$ is as given by equation 3. This is another way of saying that the mathematical solution then degenerates to that shown in the prior art of FIGS. 22A–22C. The telescoping effect implied by equation (6) allows an encoding scheme for half as many levels to be used to provide dynamic range in amplitude modulation for a 4-level mask. This result is in no way suggested or implied by the prior art.

FIG. 7 subapertures 122, 123 are encoded in this manner.

The generalization to larger number of levels is straightforward; they proceed as the now obvious generalization of the N=4 case and all that needs to be determined is the angle θ at which the transition from one phase level to another occurs. For the important case of an N=8 levels, we have for A≧Ath.:

$$\Phi_8(\phi,A) = \begin{cases} -\pi/2 & |\phi + \pi/2| \leq \pi/4 - \theta \\ 0 & |\phi| \leq \pi/4 - \theta \\ \pi/2 & |\phi - \pi/2| \leq \pi/4 - \theta \\ -3\pi/4 & |\phi + 3\pi/4| \leq \theta \\ -\pi/4 & |\phi + \pi/4| \leq \theta \\ \pi/4 & |\phi - \pi/4| \leq \theta \\ 3\pi/4 & |\phi - 3\pi/4| \leq \theta \\ \pi & \text{otherwise} \end{cases} \quad (7)$$

while for A≦Ath:

$$\Phi_8(A, \phi) = \Phi_4(A/Ath, \phi) \quad (8)$$

and in both equation (7) and (8)

$$\Theta = \sin^{-1}(A) - 3\pi/8 \quad (9)$$

$$Ath = \sqrt{\eta(4)/\eta(8)} \approx 0.924 \quad (10)$$

In equation (10), $\eta(n)$ is the maximum diffraction efficiency of an n-level phase mask which is given by:

$$\eta(n) = (\sin(\pi/n)/(\pi/n))^2 \quad (11)$$

and the other symbols take on their prior meaning.

The telescoping nature of this technique will be/evident from the following explicit formula for $N=2^M$ phase levels:

$$\Phi_{2^m}(\phi,A) = \begin{cases} \phi_j & |\phi - \phi_j| \leq \pi/2^{m-1} - \theta \\ \phi'_k & |\phi - \phi'_k| \leq \theta \\ \pi & \text{otherwise} \end{cases} \quad A > Ath \quad (12)$$

$$= \Phi_{2^{m-1}}(\phi, A/Ath) \quad A \leq Ath$$

$$Ath = \sqrt{\eta(2_{m-1})/\eta(2^m)} \quad (13)$$

$$\theta = \sin^{-1}\left(A - \frac{\pi}{2}\right) + \pi/2^m \quad (14)$$

$$\phi_j = -\pi + \frac{\pi}{2^{m-2}} j \, (j=1, 2, \ldots, 2^{m-1} - 1) \quad (15)$$

$$\phi_K' = -\pi + \frac{\pi}{2^{m-1}} (2K - 1) \, (K=1, 2, \ldots, 2^{m-1}). \quad (16)$$

In equations, the previously undefined symbols have the following meanings:

$\Phi_2^m$ is the encoded phase profile of $2^m$ levels, $\phi_j$ and $\phi'_k$ are the sets of phase values assumed by $\Phi_2^m$.

In general, if the number of levels, N, is a composite number (that is it can be nontrivially factored) then we can construct telescoping schemes which successively reduce the number of levels by a prime factor of N. Thus if $N=N_1 N_2$ where $N_1$ is prime, we successively reduce the widths of $(N_1-1)\cdot N_2$ levels until at a threshold amplitude the number of levels collapses to $N_2$. Thereafter, if $N_2$ is composite we can proceed as above; otherwise, for $N_2$ prime, we equally shrink $N_2-1$ grating widths.

Chirping

The previously discussed feature width amplitude modulation technique allows amplitude modulation by varying the width of the local grating features. One limitation of that technique is that as the amplitude modulation A, approaches zero (and at other transition points in multilevel diffractive optical elements) so do feature sizes on the diffractive optical element. At some point, the fabrication technology used in creating the diffractive optical element sets a lower limit on the feature size. As a result, the amplitude modulation dynamic range is limited. The present invention allows a greater amplitude modulation dynamic range to be encoded than would otherwise be possible.

Figure 25A:
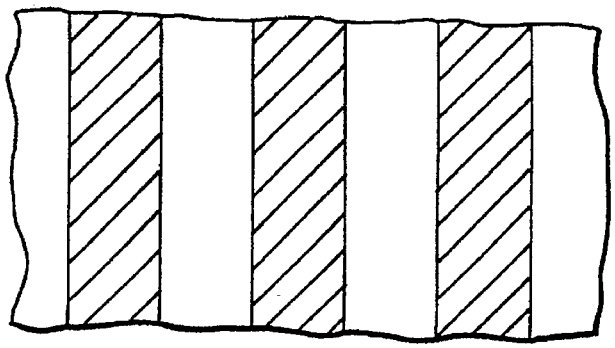

FIG. 25A illustrates part of a binary grating with local grating period GP; the hatched legions are etched. The size of the etched and unetched regions are both=GP/2 and the relative amplitude, A,=1 so that light scattered into the +1 order is diffracted with overall efficiency=

$$\left(\frac{2}{\pi}\right)^2 A^2 \approx 0.405.$$

Figure 25B:
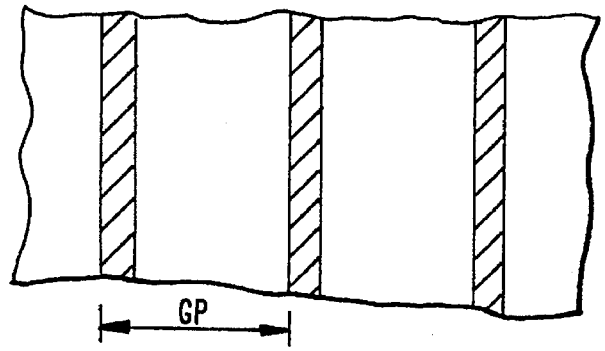

In FIG. 25B, the etched regions are GP/6 wide and the unetched regions ⅚ GP wide so that A=½ and light scattered into the +1 order is diffracted with overall efficiency=

$$\left(\frac{2}{\pi} A\right)^2 = \frac{1}{\pi^2} \approx 0.101.$$

Now if cannot fabricate we features smaller than GP/2, we cannot amplitude modulate gratings of period GP to amplitudes A<1.

Figure 25C:
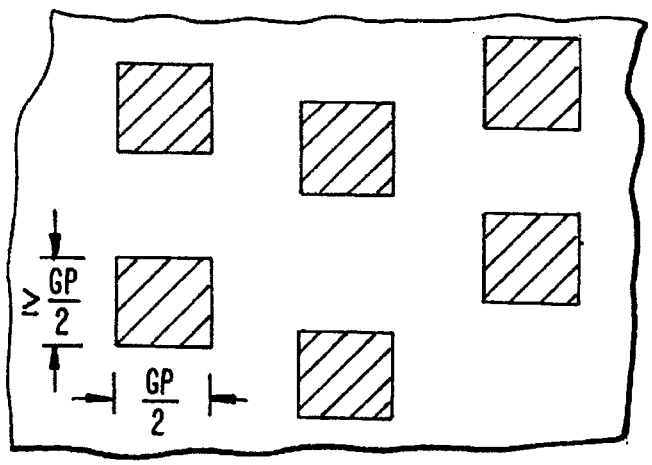
Figure 25D:
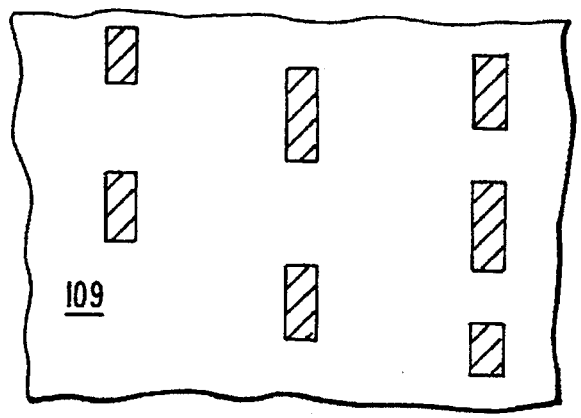

Part of a pattern whose local grating period is GP is illustrated in FIG. 25C. There, the amplitude modulation is achieved by chirping or randomly etching the grating in sections. The probability, P, that a "cell" or GP/2 sized rectangle is etched is given by:

$$P = A \quad (17)$$

Where A is the local amplitude modulation on the diffractive optical element. With this technique, amplitude modulation to any degree is achievable on binary patterns, without placing any further demand on the fabrication technology than that required to fabricate equal width line and space patterns.

Figure 26:
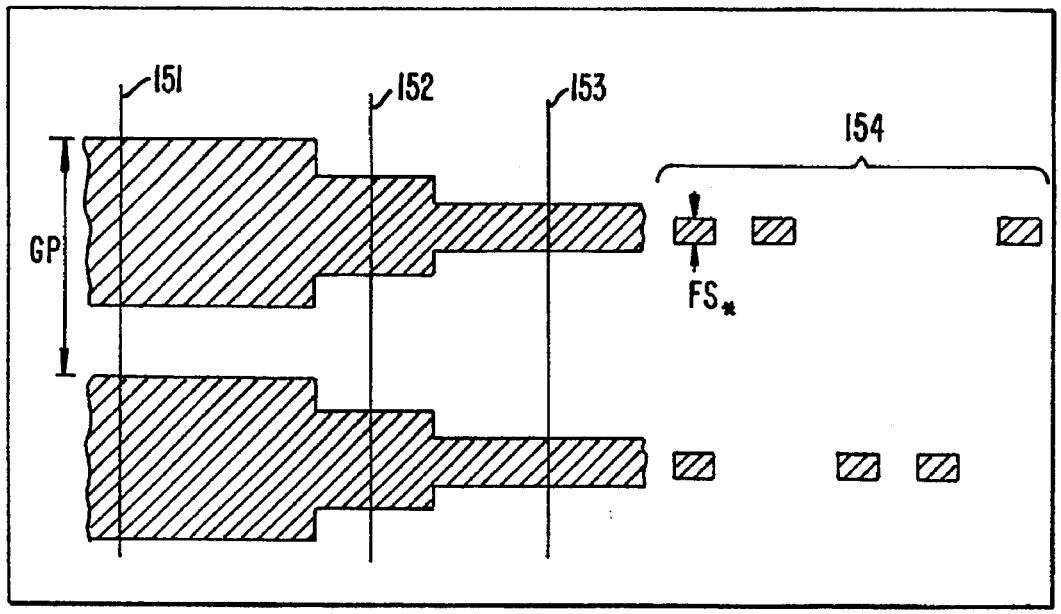
FIG. 26 is a schematic illustrating of a grating which combines both feature width modulation and our "chirping" technique.

An alterative scheme exists that combines both chirping and feature width amplitude modulation for achieving amplitude modulation. Drawn in FIG. 26 is a portion of a binary phase diffractive optical element with local grating period GP and whose amplitude, A, varies. Along line 151, A=1 so that etched features are GP/2 wide while along lines 152 & 153 we have reduced the width of the etched area in order to modulate the amplitude in accordance with equation (3). If FS is the feature size (groove width) along lines 151, 152 or 153, then the local amplitude modulation is given by:

$$A = \sin(\pi \, FS/GP) \quad (18)$$

If FS* is the smallest feature size our fabrication technology permits, then equation (18) says that the smallest achievable amplitude modulation is:

$$A_2 = \sin(\pi \, FS^*/GP). \quad (19)$$

Referring to FIG. 26, we can achieve values of amplitude modulation, A, <$A_2$ if we maintain the feature size at the minimum, FS*, but chirp them with probability, P, given by:

$$P = A/A_2 = A/\sin(\pi FS^*/GP). \quad (20)$$

Another advantage of the chirping technique is that the data defining the grating must usually be laid out on a grid with a finite address unit (AU), the amplitude modulation spectrum achievable using feature width amplitude modulation is not continuous but takes on the discrete values:

$$A_n = \sin(\pi\, n\, AU/GP), \quad n=\text{integer, and } A_n \quad (21)$$

the allowable discrete set of amplitudes. If this amplitude modulation spectrum is too coarse we can utilize chirping to interpolate the spectrum and fill in the gaps. To achieve an amplitude modulation of A where $A_{n+1} > A > A_n$, we produce a chirped grating of width (n+1) AU whose features occur with probability P given by:

$$P = A/A_{n+1} = A/\sin\left[\frac{\pi AU}{GP}(n+1)\right]. \quad (22)$$

So far the discussion has been restricted to binary phase diffractive optical elements. The chirping technique is also applicable to multilevel phase diffractive optical elements.

FIGS. 27A–27D are similar to FIGS. 25A–25D and illustrate this chirping technique for a plate having three steps.

Figure 28:
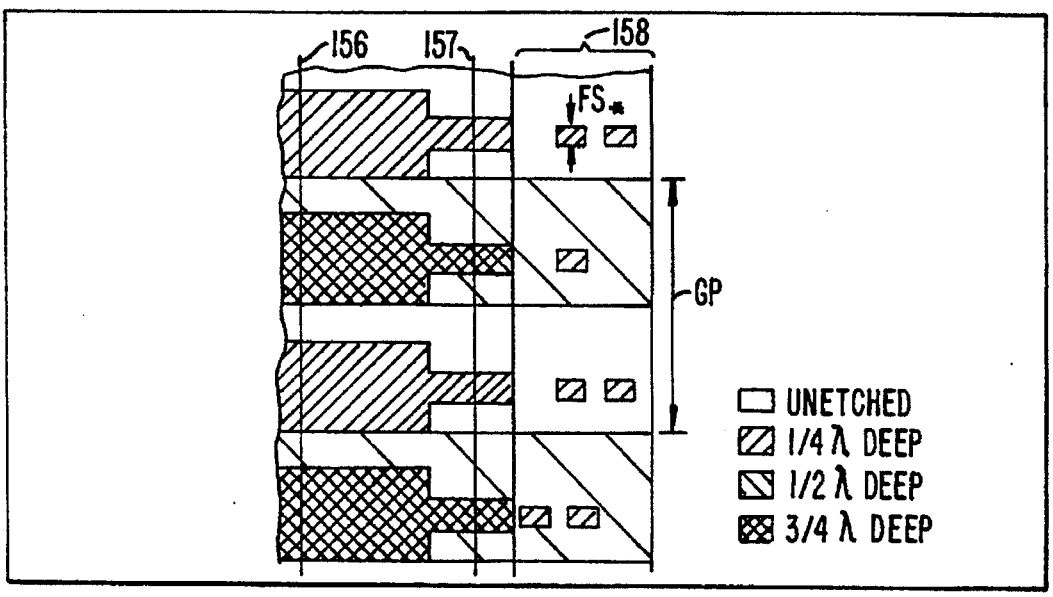
FIG. 28 is a schematic of a four level grating with the chirping and feature width amplitude modulation techniques of this invention applied thereto.
Figure 27A:
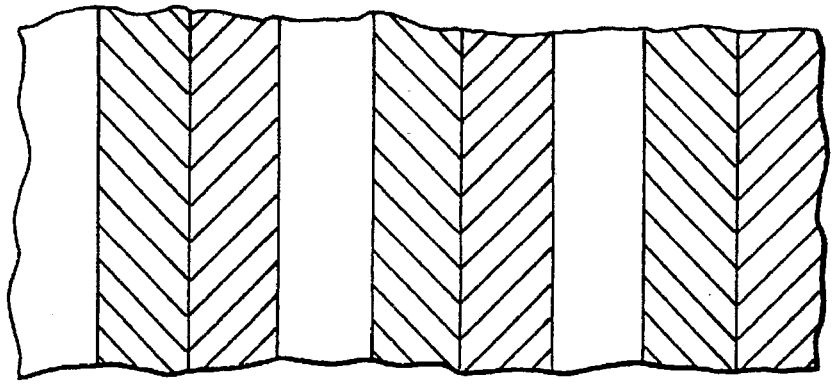
Figure 27B:
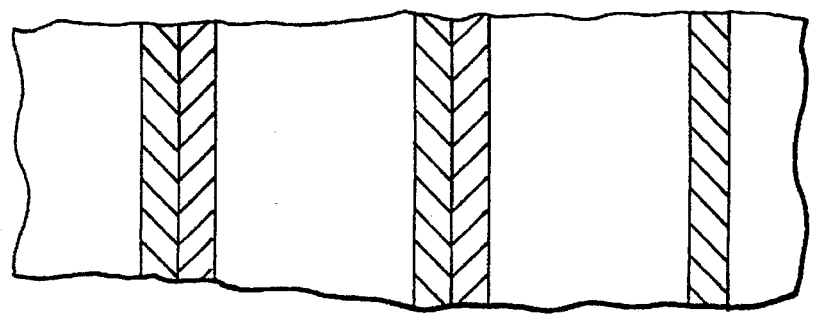
Figure 27C:
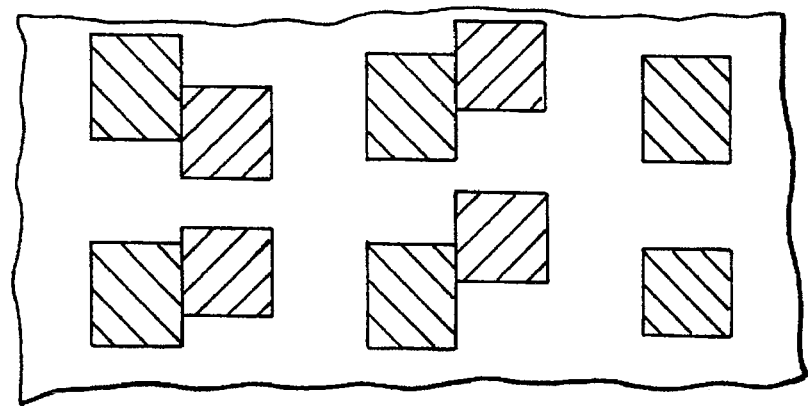
Figure 27D:
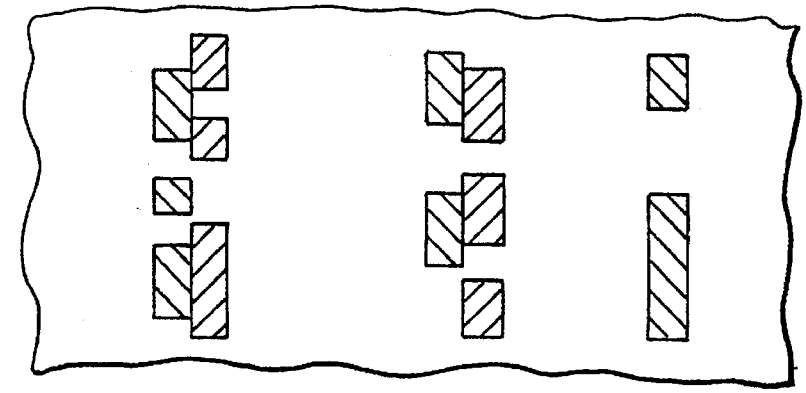

FIG. 28 illustrates a portion of a four phase level diffractive optical element with local grating period GP. Along line 156, the amplitude modulation, A=1 while along line 157 the amplitude modulation is in the range $$\frac{1}{\sqrt{2}} A < 1$$

and the amplitude modulation has been achieved using the four-level feature width amplitude modulation technique. However, once A gets close to (but is still bigger than)

$$\frac{1}{\sqrt{2}},$$

the required feature size can be smaller than FS*, the minimum fabricateable feature size. When this occurs feature width amplitude modulation is no longer useful. The chirping technique can increase the available amplitude modulation dynamic range. In region 158 of FIG. 28 the $$\frac{1}{4}\lambda \text{ and } \frac{3}{4}\lambda$$

deep features have been chirped so that amplitude modulation,=A, in the range:

$$\sin\left(\frac{\pi FS_*}{GP} + \frac{\pi}{4}\right) \geq A \geq \frac{1}{\sqrt{2}} \quad (23)$$

is achievable. This is accomplished by including features of size=FS* with probability P given by:

$$P = \left(A - \sqrt{\frac{1}{2}}\right) \bigg/ \left(\sin\left(\frac{\pi FS_*}{GP} + \frac{\pi}{4}\right) - \sqrt{\frac{1}{2}}\right) \quad (24)$$

When the desired amplitude modulation falls below √½, the local grating no longer has four phase levels, it contains only two phase levels. In this regime (A<√½) we can apply the previously described chirping method for amplitude modulation.

Figure 29A:
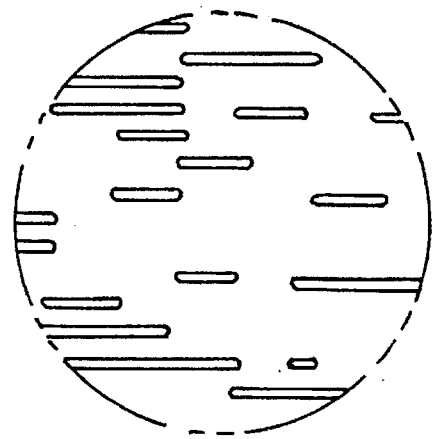
FIGS. 29A is a magnified view of a randomly "chirped" section of the plate of FIG. 29B.
Figure 29B:
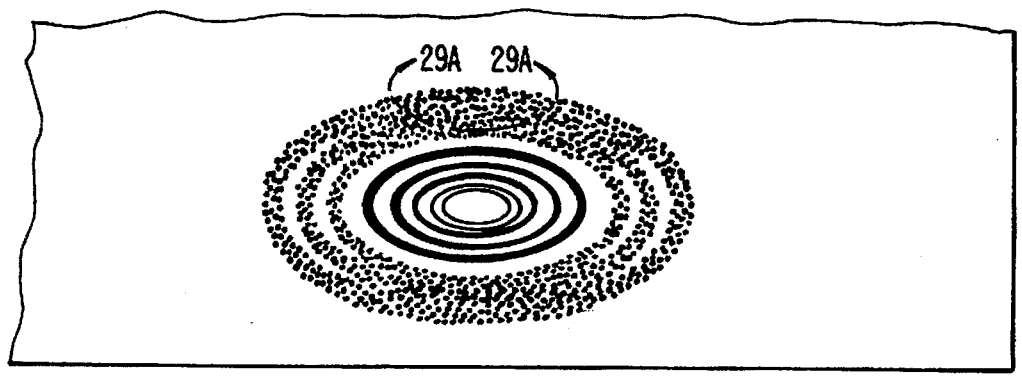

FIGS. 29A and 29B are drawings of a randomly chirped binary pattern. This is an example of the chirping of a binary grating.

The technique described above is what we call chirping. In addition to binary and 4-level phase diffractive optical elements, chirping is applicable to diffractive optical elements containing other numbers of phase levels. Even though we have described this technique as applied to phase diffractive optical elements, it can also he applied, with minor modifications, to amplitude diffractive optical elements and mixed phase and amplitude diffractive optical elements.

For completeness we give below the formulas for the chirping probabilities for $N=2,3,4,2^m$ phase level masks. In what follows, the following symbols take on the meanings:

$$GP = \text{local grating period} = 2\pi/|\overline{\nabla}\phi(\bar{x})| \quad (25)$$

$$\eta(N) = \left(\begin{array}{c}\text{highest diffraction an } N\\ \text{phase level } CGH \text{ can have}\end{array}\right) = \left[\frac{\sin(\pi/N)}{(\pi/N)}\right]^2 \quad (26)$$

$$FS^* \text{ smallest fabricateable feature size} \quad (27)$$

(can possibly vary with level depth).

$$A = \text{relative amplitude of light scattered} \quad (28)$$

into the +1 order.

$$P(A;N,L) = \text{probability we chirp a feature} \quad (29)$$

on the Lth level of an N-level mask when the desired local amplitude modulation=A.

Then for a binary pattern (N=2) we have:

$$P\left(A; N=2, L=\frac{1}{2}\right) = \begin{cases} 1 & A > A_* \\ A/A_* & A \leq A_* \end{cases} \quad (30)$$

$$A_* = \sin(\pi\, FS_*/GP),\ FS_* \geq GP/2. \quad (31)$$

For a tertiary pattern (N=3) we have:

$$P\left(A; N=3, L=\frac{1}{3} \text{ or } \frac{2}{3}\right) = \begin{cases} 1 & A > A_* \\ A/A_* & A \leq A_* \end{cases} \quad (32)$$

$$A_* = \frac{1}{3} + \frac{2}{3}\cos\left(\frac{2\pi}{3} - 2\pi\frac{FS_*}{GP}\right) \quad (33)$$

$$FS_* \geq GP/3.$$

For a 4 level pattern (N=4) we have;

$$P\left(A; N=4, L=\frac{1}{4},\frac{3}{4}\right) = \begin{cases} 1 & A_* \leq A \leq 1 \quad (34)\\ \dfrac{A - \sqrt{\frac{1}{2}}}{A_* - \sqrt{\frac{1}{2}}} & \sqrt{\frac{1}{2}} \leq A \leq A_* \\ 0 & A < \frac{1}{\sqrt{2}} \end{cases}$$

for $FS^* \geq GP/4$ $$P\left(A; N=4, L=\frac{1}{2}\right) = \begin{cases} 1 & A > \frac{1}{\sqrt{2}} \quad (35)\\ P\left(A/\sqrt{\frac{1}{2}}\ ;\ N=2, L=\frac{1}{2}\right) & A \leq \frac{1}{\sqrt{2}} \end{cases}$$

for $FS^* \geq GP/2$;

when A* is given by:

$$A* = \sin\left(\frac{\pi FS*}{GP} + \frac{\pi}{4}\right) \quad (36)$$

For an $N=2^m$ level mask we have:

$$P\left(A; N=2^m, L=\frac{\text{odd number}}{N}\right) = \begin{cases} 1 & A* \leq A \leq 1 \\ \frac{A - \sqrt{\eta(2^{m-1})/\eta(2^m)}}{A* - \sqrt{\eta(2^{m-1})/\eta(2^m)}} & \sqrt{\frac{\eta(2^{m-1})}{\eta(2^m)}} \leq A \leq A* \\ 0 & A \leq \sqrt{\frac{\eta(2^{m-1})}{\eta(2^m)}} \end{cases} \quad (37)$$

$$A* = \sin\left(\pi \frac{FS*}{GP} + \frac{\pi}{2} - \frac{\pi}{2^m}\right) \quad (38)$$

$$P\left(A, N=2^m, L=\frac{\text{even }\#}{N}\right) = \begin{cases} 1 & A \geq \sqrt{\frac{\eta(2^{m-1})}{\eta(2^m)}} \\ P\left(A/\sqrt{\frac{\eta(2^{m-1})}{\eta(2^m)}}, N=2^{m-1}, L\right) \end{cases} \quad (39)$$

In general, if the number of levels, N, is a composite number, then we can construct telescoping schemes involving chirping and possibly feature width amplitude modulation which successively reduce the number of levels by a prime factor of N. Thus, if $N=N_1N_2$ where $N_1$ is prime, we successively chirp $(N_1-1)\cdot N_2$ levels until at a threshold amplitude the number of levels collapses to $N_2$. Thereafter, if $N_2$ is composite, we can proceed as above; otherwise for $N_2$ prime, we chirp $N_2-1$ levels.

The material processing method and system of the present invention permits many locations to be processed simultaneously, providing high system throughput while efficiently using available laser power. The processing steps for producing FZPs by standard lithographic techniques allow arbitrary patterning for customization of plates in accordance with a user's requirements. The alignment subsystem permits repeatable positioning further allowing whole field stepping to increase throughput.

Figure 30:
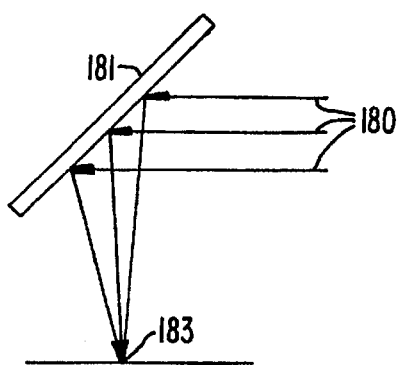

FIG. 30 is one example of a hologram operating in reflection mode. Coherent light 180 is incident on hologram 181, the incident light being reflected and diffracted by hologram 181 and forming a feature 183 on workpiece surface 182.

Figure 31:

FIG. 31 is a plan view of the feature 183 created by hologram 181. In this case, the feature is a circular top hat intensity profile.

Figure 32:
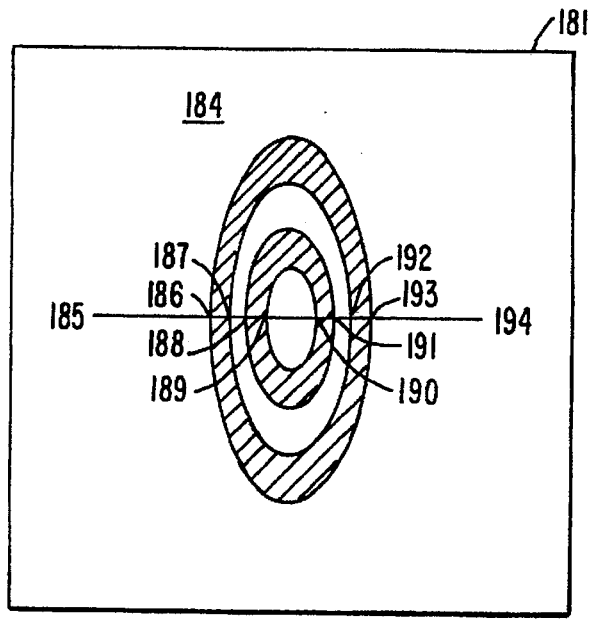

FIG. 32 is a plan view of hologram 181. It contains a single diffractive lens 184, consisting of concentric elliptical rings which together diffract the incident light 180. The entire surface of hologram 181 is covered with a reflective coating and the shaded regions are depressions which retard the incident wavefront by one-half of a wavelength upon reflection. These depressions have been etched into the substrate to a single depth since this example illustrates a binary phase only reflective hologram.

Line 185–194 goes through the center of this lens and the transition points from etched to not etched are indicated by the intervening numerals.

Figure 33:
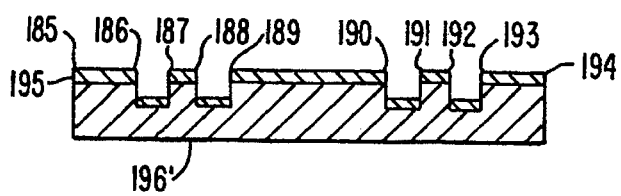

FIG. 33 is a cross-sectional view through line 185–194. In FIG. 33, a conformal, reflective coating 195 covers the patterned substrate 196.

Figure 34:
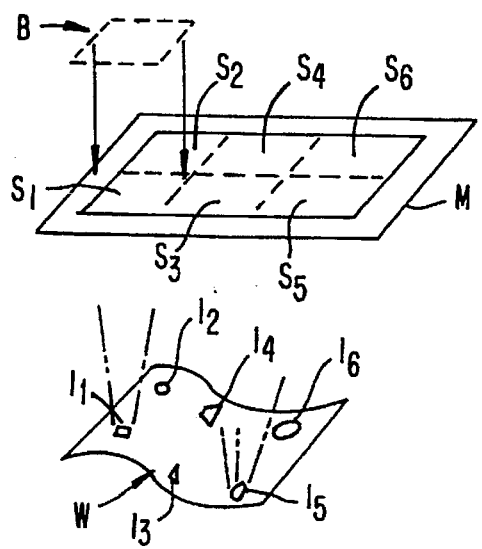

The computer generated hologram of this invention has the advantage that the working images can be generated at surfaces which do not constitute a plane. FIG. 34 represents such case. Curved workpiece $W_C$ is shown having working images $I_1$–$I_6$ incident thereon. It can be seen that the respective images from subapertures $S_1$–$S_6$ impact curved workpiece $W_C$ at different distances from mask M. A beam B exceeding the size of the largest subaperture is shown scanning mask M to sequentially generate the required images. It will be understood that curved workpiece $W_C$ could also be a piece containing separate planes and separate and different elevations.

It will be evident that there are additional embodiments which are not illustrated above but which are clearly within the scope and spirit of the present invention. The above description and drawings are therefore intended to be exemplary only and the scope of the invention is to be limited solely by the appended claims.

What is claimed is:

1. An optical plate, said plate having optical features forming a computer generated hologram including patterns of said optical features arrayed in regular fringes with local grating periods for producing from coherent light incident on said plate a working holographic image for processing materials, the improvement in said plate comprising a feature width variation for producing amplitude modulation comprising;

a plurality of classes of optical features for causing coherent light on said features to be shifted at least in phase;

the widths of features in the direction of the local grating period varying, the variation in width being proportional to design amplitude variation of said plate; and, at least some of the features being optical encoding features forming fringes;

said fringes randomly interrupted in proportion to the amplitude desired at said working holographic image whereby the regular remaining portion of said fringes produces said working image.

2. An optical plate in accordance with claim 1 wherein; said optically encoded features shift phase and amplitude.

3. An optical plate for producing from a plane wave front of coherent light incident on said plate at subapertures within said plate working images for incidence to a workpiece for processing said workpiece with said working images, said plate including:

a plurality of subapertures, each said subaperture having arrayed optical elements configured thereon for producing by each optical element phase and amplitude changes to a plane wave front of coherent light incident upon said plate to at least one working image for producing a workpiece;

said plate suitable for scanning by an incident beam of coherent light and producing from said subapertures said working images having a working effect at a workpiece whereby an incident beam of coherent light at each subaperture will have an incident wave modulated in phase and amplitude by the optical elements of the plate to produce from each subaperture as it is scanned the working image on a workpiece being processed;

said subaperture being a computer generated hologram;

the improvement in said plate comprising:

said subaperture having two or more optical encoding features;

said optical encoding features forming regular fringes;

said regular fringes randomly interrupted in proportion to the amplitude desired at said working image whereby the regular remaining portion of said fringes produces said working image.

4. An optical plate for producing from subapertures working images for incidence to a workpiece for processing said workpiece with said working image according to claim 3 and wherein:

said plate is reflective.

5. An optical plate for producing from subapertures working images for incidence to a workpiece for processing said workpiece with said working image according to claim 3 wherein:

said plate is transmissive.

6. An optical plate for producing from subapertures working images for incidence to a workpiece for processing said workpiece with said working image according to claim 3 wherein:

more than one of said subapertures of said plate producing a discrete working image; and, the area of the smallest subaperture in said plate being less than 51% of an area comprising the union of all said subapertures in said plate.

7. An optical plate for diffracting coherent light and modulating the phase and amplitude of said coherent light said plate comprising:

said plate is a computer generated hologram;

said plate having two or more optical encoding features;

said optical encoding features forming regular fringes;

said regular fringes randomly interrupted in proportion to the amplitude of said light desired at said optical feature whereby the remaining portion of said fringes produces a working image.

8. An optical plate for diffracting coherent light according to claim 7 and wherein:

said plate operates in transmission mode.

9. An optical plate for diffracting coherent light according to claim 7 and wherein:

said plate operates in reflection mode.

10. An optical plate for diffracting coherent light according to claim 7 and wherein:

said plate is a binary amplitude or phase computer generated hologram;

the local amplitude modulation of coherent light diffracted in the desired order being denoted by A;

the minimum manufacturable feature size being $FS_*$ and the local grating period being GP;

the required feature width being $(GP/\pi)*\sin^{-1}(A)$;

the required feature width being less than the minimum manufacturable feature size $FS_*$;

then the normally continuous fringe pattern is randomly interrupted with probability $P=A/A_*$; and, $$A_* = \sin(\pi FS_*/GP);$$

the fabricated feature width now being equal to $FS_*$, the minimum manufacturable feature width.

11. An apparatus including a scanning beam of coherent light of selected frequency and a plate for scan by said beam of coherent light comprising in combination;

a plate for modulating in phase and amplitude of the coherent light incident upon said plate in the form of a plane wave;

said plate having a plurality of subapertures, each said subaperture including a computer generated hologram including optical features for generating upon incidence of said coherent light a working image at a distance from said plate;

means for scanning said plate with a beam of coherent light, said beam of light having a diameter greater than the largest subaperture with a fluence exceeding 1 millijoule per square centimeter and power exceeding 1 milliwatt per square centimeter, said means for scanning sequentially incident on said subapertures to produce sequentially said working images; and, said working images having sufficient power to produce at a work piece an irreversible effect.

12. An apparatus including a scanning beam of coherent light of selected frequency and a plate for scan by said beam of coherent light according to claim 11 comprising in further combination;

at least one of the subapertures having a working image where the centroid of the subaperture and the centroid of the working image are off set from one another.

13. An apparatus including a scanning beam of coherent light of selected frequency and a plate for scan by said beam of coherent light according to claim 11 comprising in further combination;

focal length of the image to subaperture diameter ratio exceeding 5.

14. An apparatus including a scanning beam of coherent light of selected frequency and a plate for scan by said beam of coherent light according to claim 11 comprising in further combination;

said plate suitable for use with a coherent source having average power in excess of one watt.

15. An apparatus including a scanning beam of coherent light of selected frequency and a plate for scan by said beam of coherent light according to claim 11 comprising in further combination;

said plate being designed for wavelengths less than 0.419 microns.

16. An apparatus including a scanning beam of coherent light of selected frequency and a plate for scan by said beam of coherent light according to claim 11 comprising in further combination;

said plate being designed for use with excimer lasers.

17. An apparatus including a scanning beam of coherent light of selected frequency and a plate for scan by said beam of coherent light according to claim 11 comprising in further combination;

said plate being designed for use with carbon dioxide lasers.

18. An apparatus including a scanning beam of coherently light of selected frequency and a plate for scan by said beam of coherent light according to claim 11 comprising in further combination;

said plate being designed for use with neodymium lasers and harmonics thereof.

19. An apparatus including a scanning beam of coherent light of selected frequency and a plate for scan by said beam of coherent light according to claim 11 comprising in further combination;

said plate being designed for use with noble gas ion lasers.

20. An apparatus including a scanning beam of coherent light of selected frequency and a plate for scan by said beam of coherent light according to claim 11 comprising in further combination;

said plate being designed for use with helium-cadmium lasers.

21. An apparatus including a scanning beam of coherent light of selected frequency and a plate for scan by said beam of coherent light according to claim 11 comprising in further combination;

said plate being designed for use with copper and gold vapor lasers.

22. An apparatus including a scanning beam of coherent light of selected frequency and a plate for scan by said beam of coherent light according to claim 11 comprising in further combination;

said plate being designed for use with carbon monoxide lasers.

23. An apparatus including a scanning beam of coherent light of selected frequency and a plate for scan by said beam of coherent light according to claim 11 comprising in further combination;

said plate operating in reflection mode.

24. An apparatus including a scanning beam of coherent light of selected frequency and a plate for scan by said beam of coherent light according to claim 11 comprising in further combination;

said irreversible effect includes ablation.

25. An apparatus including a scanning beam of coherent light of selected frequency and a plate for scan by said beam of coherent light according to claim 11 comprising in further combination;

more than one of said subapertures of said plate producing a discrete working image; and, the area of the smallest subaperture in said plate being less than 51% of the area comprising the union of all said subapertures in said plate.

26. An apparatus including a scanning beam of coherent light of selected frequency and a plate for scan by said beam of coherent light according to claim 11 comprising in further combination;

the workpiece surface is not a plane.

27. An apparatus including a scanning beam of coherent light of selected frequency and a plate for scan by said beam of coherent light according to claim 11 comprising in further combination;

subapertures of said plate are designed by back propagation.

28. An apparatus including a scanning beam of coherent light of selected frequency and a plate for scan by said beam of coherent light according to claim 11 comprising in further combination;

subapertures of said plate are designed with simulated annealing.

29. An apparatus including a scanning beam of coherent light of selected frequency and a plate for scan by said beam of coherent light according to claim 11 comprising in further combination;

subapertures of said plate are designed with Gerchberg-Saxon algorithm.

30. A plate for scan by a beam of coherent light of a selected frequency comprising in combination;

a plate for modulating in phase and amplitude of the coherent light incident upon said plate in the form of a plane wave;

said plate having a plurality of subapertures, each said subaperture including optical features for generating upon incidence of said coherent light a working image at a distance from said plate;

said subaperture being a computer generated hologram for generating a working image at a distance less than 50 centimeters from said subaperture with said distance being more than 5 times the diameter of said subaperture;

said plate having a surface for the incidence of light at levels exceeding 1 millijoule per centimeter squared fluence and 1 milliwatt per centimeter squared without an irreversible effect on said plate power to produce a working image having at least 10 millijoulles per square centimeter at a workpiece for use in materials patterning.

31. A plate for scan by a beam of coherent light of a selected frequency according to claim 30 and further comprising in combination;

at least one of the subapertures having a working image where the centroid of the subaperture and the centroid of the working image are off set from one another whereby said working image from said subaperture is offset from the vertical with respect to said subaperture.

32. A plate for scan by a beam of coherent light of a selected frequency according to claim 30 and further comprising in combination;

focal length of the image to subaperture diameter ratio exceeding 15.

33. A plate for scan by a beam of coherent light of a selected frequency according to claim 30 and further comprising in combination;

said plate suitable for use with a coherent source having average power in excess of one watt.

34. A plate for scan by a beam of coherent light of a selected frequency according to claim 30 and further comprising in combination;

said plate being designed for wavelengths less than 0.419 microns.

35. A plate for scan by a beam of coherent light of a selected frequency according to claim 30 and further comprising in combination;

said plate being designed for production of working images from said subapertures in wavelengths between 1,000 Å and 4,000 Å.

36. A plate for scan by a beam of coherent light of a selected frequency according to claim 30 and further comprising in combination;

said subapertures being designed for producing working images at distances between 5 and 20 centimeters.

37. A plate for scan by a beam of coherent light of a selected frequency according to claim 30 and further comprising in combination;

said plate having subapertures for producing images at F numbers exceeding 16.

38. A plate for scan by a beam of coherent light of a selected frequency according to claim 30 and further comprising in combination;

said plate being designed for use with laser having power in excess of 10 watts.

39. A plate for scan by a beam of coherent light of a selected frequency according to claim 30 and further comprising in combination;

said plate having subapertures designed for producing working images at F numbers exceeding 50.

40. A plate for scan by a beam of coherent light of a selected frequency according to claim 30 and further comprising in combination;

said plate operating in reflection mode.

41. A plate for scan by a beam of coherent light of a selected frequency according to claim 30 and further comprising in combination;

said holographic plate operating in transmission mode.

42. A plate for scan by a beam of coherent light of a selected frequency according to claim 30 and further comprising in combination;

more than one of said subapertures of said plate producing a discrete working image; and, the area of the smallest subaperture in said plate being less than 51% of the area comprising the union of all said subapertures in said plate.

43. A plate for scan by a beam of coherent light of a selected frequency according to claim 30 and further comprising in combination;

the workpiece surface is not a plane.

44. A plate for scan by a beam of coherent light of a selected frequency according to claim 49 and further comprising in combination;

subapertures of said plate are designed by back propagation.

45. A plate for scan by a beam of coherent light of a selected frequency according to claim 30 and further comprising in combination;

subapertures of said plate are designed with simulated annealing.

46. A plate for scan by a beam of coherent light of a selected frequency according to claim 30 and further comprising in combination;

subapertures of said plate are designed with Gerchberg-Saxon algorithm.

* * * * *